(12) United States Patent
Yajima et al.

(10) Patent No.: US 7,420,441 B2
(45) Date of Patent: Sep. 2, 2008

(54) METHOD OF MANUFACTURING MONOLITHIC SURFACE ACOUSTIC WAVE DEVICE AND INTEGRATED CIRCUIT

(75) Inventors: Aritsugu Yajima, Machida (JP); Hisakatsu Sato, Sakata (JP); Takashi Kojima, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 272 days.

(21) Appl. No.: 11/304,766

(22) Filed: Dec. 16, 2005

(65) Prior Publication Data

US 2006/0131678 A1 Jun. 22, 2006

(30) Foreign Application Priority Data

Dec. 20, 2004 (JP) ............................. 2004-367210
Sep. 16, 2005 (JP) ............................. 2005-269716

(51) Int. Cl.
*H03H 9/00* (2006.01)
(52) U.S. Cl. ................ 333/193; 29/25.35; 438/14; 438/17; 257/414
(58) Field of Classification Search ............... 333/193; 29/25.35; 438/14, 17; 257/414
See application file for complete search history.

(56) References Cited

U.S. PATENT DOCUMENTS

| | | | |
|---|---|---|---|
| 4,647,881 A | | 3/1987 | Mitsutsuka |
| 5,265,267 A | * | 11/1993 | Martin et al. ............... 455/326 |
| 5,695,384 A | * | 12/1997 | Beratan ...................... 451/28 |
| 6,049,132 A | * | 4/2000 | Iwahashi et al. ............ 257/763 |
| 6,285,866 B1 | * | 9/2001 | Lee et al. .................... 455/318 |
| 6,767,749 B2 | * | 7/2004 | Kub et al. .................... 438/3 |

(Continued)

FOREIGN PATENT DOCUMENTS

JP A-2005-348026 12/2005

OTHER PUBLICATIONS

J.H. Visser et al.; "Surface Acoustic Wave Filters in Zn O—SiO$_2$—Si Layered Structures"; Ultrasonic Simposium, 1989; Proceedings, IEEE 1989, Oct. 3-6, 1989; pp. 195-200; vol. 1.

(Continued)

*Primary Examiner*—Benny Lee
*Assistant Examiner*—Eric R Hamill
(74) *Attorney, Agent, or Firm*—Oliff & Berridge, PLC

(57) ABSTRACT

A method of manufacturing a surface acoustic wave device formed in one chip and including over a semiconductor substrate at least an IC region and a surface acoustic wave element region that are horizontally disposed, the method including: forming in the IC region over the semiconductor substrate a semiconductor element layer that includes a semiconductor element and an insulation layer covering the semiconductor element and being deposited also in the surface acoustic wave element region; forming over the semiconductor element layer a wire layer that includes a plurality of wires coupled to the semiconductor element and a wire insulating film deposited over the plurality of wires to provide insulation among the wires, the wire insulating film being deposited also over the insulation layer in the surface acoustic wave element region; forming an interlayer insulating film having a flattened surface on the wire insulating film in the IC region and the surface acoustic wave element region; forming a piezoelectric thin film on the interlayer insulating film; and forming a surface acoustic wave element on the piezoelectric thin film in the surface acoustic wave element region.

17 Claims, 21 Drawing Sheets

U.S. PATENT DOCUMENTS 7,112,860 B2 * 9/2006 Saxler .................. 257/416
2002/0149019 A1 10/2002 Iwashita et al.

OTHER PUBLICATIONS

IEEE Electron Device Letters, vol. 21, No. 8, Aug. 2000, "Reference SAW Oscillator on Quartz-on-Silicon (QoS) Wafer for PolyLithic Integration of True Single Chip Radio", Yunseong Eo et al., pp. 393-395.

Widmann, D.; Mader, H.; Friedrich, H.: "Technologie hochintegrierter Schaltungen (Seiten 35, 67, 68, 71-74, 96, 97, 183-186, 269-277, 297-302, 307, 308)" 1996, Springer Verlag, Berlin Heidelberg, XP002375064, p. 35, paragraphs 1,3, p. 67, paragraph 2,3, p. 73, paragraph 2—p. 74, paragraph 1, p. 97, paragraph 2, p. 183, paragraph 7, p. 186, paragraph 1, 2, p. 274, paragraph 6—p. 275, paragraph 1; table 8.4, p. 297, paragraphs 3, 4, p. 298, paragraph 1—p. 301, paragraph 1, p. 301, paragraph 4—p. 302, paragraph 2.

Nelson M. et al: "Optimizing pattern fill for planarity and parasitic capacitance" Advanced Semiconductor Manufacturing, 2004. ASMC '04. IEEE Conference and Workshop Boston, MA, USA May 4-6, 2004, Piscataway, NJ, USA, IEEE, US, May 4, 2004, pp. 115-118, XP010768975 ISBN: 0-7803-8312-5 introduction.

Eo Yunseong et al: "Reference SAW oscillator on quartz-on-silicon (QoS) wafer for polylithic integration of true single chip radio" IEEE Electron Device Lett; IEEE Electron Device Letters Aug. 2000 IEEE, Piscataway, NJ, USA, vol. 21, No. 8, Aug. 2000, pp. 393-395, XP011018815, p. 393, right-hand column, paragraph 1; figure 1.

Vellekoop M. J. et al. "Integrated-Circuit-Compatible Design and Technology of Acoustic-Wave-Based Microsensors" Sensors and Actuators A, Elsevier Sequoia S.A., Lausanne, CH, vol. A44, No. 3, Sep. 1, 1994, pp. 249-263, XP000483969, ISSN: 0924-4247, p. 251, left-hand column, paragraphs 2, 3, 5, p. 255, paragraph 5; figure 12, p. 256, right-hand column, paragraph 4—p. 257, right-hand column, paragraph 3.

Ried R P et al: "Piezoelectric Microphone With On-Chip CMOS Circuits" Journal of Microelectromechanical Systems, IEEE Service Center, Piscataway, NJ, US, vol. 2, No. 3, Sep. 1, 1993, pp. 111-120, XP000426531, ISSN: 1057-7157, p. 112, right-hand column, paragraph 2; figure 1.

Sugai K et al: "SAW programmable notch filters for adaptive interference suppression" IEEE Ultrasonics Symposium, Oct. 3, 1989, pp. 201-206, XP010090621, II ii) Device Structure, figures 1, 3.

* cited by examiner

US 7,420,441 B2

METHOD OF MANUFACTURING MONOLITHIC SURFACE ACOUSTIC WAVE DEVICE AND INTEGRATED CIRCUIT

BACKGROUND OF THE INVENTION

1. Technical Field

The present invention relates to a method of manufacturing a surface acoustic wave device that is obtained by forming in one chip an IC region and a surface acoustic wave element region over a semiconductor substrate, and a surface acoustic wave device.

2. Related Art

Surface acoustic wave elements typified by SAW resonators and SAW filters have excellent features: high frequency, small size, high productivity, etc., and therefore have been widely used in communication fields. In step with recent spread of portable communication apparatuses and the like, strong requirements for size and weight reduction of parts used in high frequency bands have been increasing.

In order to respond to the requirements, a related-art document, J. H. Viseer, IEEE, Ultrasonics Symposium, p. 195-200 (1989) for example, has proposed a surface acoustic wave device in which, instead of using a surface acoustic wave element as a unitary filter, a piezoelectric thin film is deposited over a semiconductor substrate part of which has thereon a high frequency amplifying circuit and the like, to thereby form a SAW filter over the semiconductor substrate.

In such a surface acoustic wave device formed in one chip by horizontally arranging an IC region and a surface acoustic wave element region over a semiconductor substrate, semiconductor elements and wires for connecting the semiconductor elements are disposed in the IC region with an insulating film therebetween. In contrast, only an insulating film is disposed in the surface acoustic wave element region. Accordingly, a step arises between the IC region and surface acoustic wave element region. Typically such surface acoustic wave devices are formed in such a manner that a large number of surface acoustic wave devices lie adjacent to each other on a semiconductor wafer. As the number of stacked layers such as insulating layers increases, the step proceeds over the surface acoustic wave element region with changing to a slope, which problematically precludes ensuring of favorable flatness of the surface of the surface acoustic wave element region. If the flatness of the surface is low, the size accuracy of a surface acoustic wave element cannot be ensured in the fabrication thereof, which deteriorates characteristics of the surface acoustic wave element. In addition, it is expected that unevenness of the surface due to the low flatness leads to variation in film thickness of a formed piezoelectric thin film, which results in the variation in resonant frequency of the surface acoustic wave element. Therefore, in such a surface acoustic wave device, the substrate needs to be flattened prior to forming a surface acoustic wave element. However, there has not been any knowledge of planarizing the surface of a surface acoustic wave element region by employing CMP (Chemical Mechanical Polishing) treatment or the like.

SUMMARY

An advantage of some aspects of the invention is to provide a method of manufacturing a surface acoustic wave device by which, in a surface acoustic wave device obtained by forming in one chip an IC region and a surface acoustic wave element region over a semiconductor substrate, the flatness of part on which a surface acoustic wave element is to be formed is ensured to thereby achieve favorable characteristics, and to provide a surface acoustic wave device.

A first aspect of the invention provides a method of manufacturing a surface acoustic wave device formed in one chip and including over a semiconductor substrate at least an IC region and a surface acoustic wave element region that are horizontally disposed. The method includes: forming in the IC region over the semiconductor substrate a semiconductor element layer that includes a semiconductor element and an insulation layerinsulation layer covering the semiconductor element and being deposited also in the surface acoustic wave element region; and forming over the semiconductor element layer a wire layer that includes a plurality of wires coupled to the semiconductor element and a wire insulating film deposited over the plurality of wires to provide insulation among the wires. The wire insulating film is deposited also over the insulation layerinsulation layer in the surface acoustic wave element region. The method also includes: forming an interlayer insulating film having a flattened surface on the wire insulating film in the IC region and the surface acoustic wave element region; forming a piezoelectric thin film on the interlayer insulating film; and forming a surface acoustic wave element on the piezoelectric thin film in the surface acoustic wave element region.

According to the method of manufacturing a surface acoustic wave device, the surface of the interlayer insulating film is flattened, and thus the piezoelectric thin film can be formed on the interlayer insulating film with keeping the flat state. Thus, the surface acoustic wave element including IDT electrodes can be formed on the piezoelectric thin film with favorable size accuracy, which can offer a surface acoustic wave device involving no variation in the resonant frequency and having favorable characteristics. Furthermore, the planarization of surface of the interlayer insulating film also leads to an advantage of enhancing the crystal orientation of the piezoelectric thin film, and thus offering a large electromechanical coupling coefficient $K^2$.

In the method of manufacturing a surface acoustic wave device according to the first aspect, it is preferable that the forming an interlayer insulating film having a flattened surface is carried out by implementing CMP treatment for a surface of an interlayer insulating film after forming the interlayer insulating film.

According to the method of manufacturing a surface acoustic wave device, the surface of the interlayer insulating film is flattened by CMP treatment, and thus the piezoelectric thin film can be formed on the interlayer insulating film with keeping the flat state. Thus, the surface acoustic wave element including IDT electrodes can be formed on the piezoelectric thin film with favorable size accuracy, which can offer a surface acoustic wave device involving no variation in the resonant frequency and having favorable characteristics.

In the method of manufacturing a surface acoustic wave device according to the first aspect, the forming an interlayer insulating film having a flattened surface may be carried out by forming an SOG film.

According to the method of manufacturing a surface acoustic wave device, an interlayer insulating film having a flattened surface can easily be obtained by using an SOG (Spin On Glass) film as the interlayer insulating film. This SOG film is obtained by spin-coating a liquid SOG material and then baking the material at a high temperature.

It is preferable that the method of manufacturing a surface acoustic wave device according to the first aspect may further include forming at least one layer-thickness adjusting film on any of the semiconductor substrate, the insulation layerinsulation layer, and the wire insulating film in the surface acoustic wave element region.

According to the method of manufacturing a surface acoustic wave device, the layer-thickness adjusting film is adequately provided on any of the semiconductor substrate, the insulation layerinsulation layer and the wire insulating film in the surface acoustic wave element region. Thus, the height of the step between the IC region and surface acoustic wave element region can be reduced, and therefore the planarization of the interlayer insulating film by CMP treatment or by formation of an SOG film can be facilitated.

In the method of manufacturing a surface acoustic wave device according to the first aspect, it is preferable that the layer-thickness adjusting film is included below the surface acoustic wave element, and is formed to have such a position and an area that a region in which the layer-thickness adjusting film is formed includes a region obtained by projecting, in a thickness direction of the surface acoustic wave device, a region in which the surface acoustic wave element is formed.

According to the method of manufacturing a surface acoustic wave device, the layer-thickness adjusting film is formed below the surface acoustic wave element to have such its position and area as to encompass the surface acoustic wave element. Thus, the height of the step due to the part on which the surface acoustic wave element is formed is reduced, which can form a surface having favorable flatness.

In the method of manufacturing a surface acoustic wave device according to the first aspect, it is preferable that the forming a layer-thickness adjusting film is carried out simultaneously with forming the wires, and the layer-thickness adjusting film is formed together with the wires in the same layer.

According to the method of manufacturing a surface acoustic wave device, the layer-thickness adjusting film can be formed in the same step as that of forming the wires in the IC region, and therefore efficient formation thereof can be achieved.

The method of manufacturing a surface acoustic wave device according to the first aspect may further include implementing CMP treatment for surfaces of the insulation layer-insulation layer and the wire insulating film after forming the insulation layerinsulation layer and the wire insulating film, or forming an SOG film as the insulation layerinsulation layer and the wire insulating film.

According to the method of manufacturing a surface acoustic wave device, if there is a need to form multi-layers in a wire layer in particular, by adequately implementing CMP treatment or forming an SOG film for the insulation layerinsulation layer and wire insulating film in the IC region and surface acoustic wave element region, the height of the step between the IC region and surface acoustic wave element region can be reduced. Thus, the planarization of the interlayer insulating film can be facilitated.

In the method of manufacturing a surface acoustic wave device according to the first aspect, it is preferable that CMP treatment is implemented or an SOG film is formed for a not-yet-diced wafer including a large number of the surface acoustic wave devices.

According to the method of manufacturing a surface acoustic wave device, by implementing CMP treatment or forming an SOG film for a not-yet-diced wafer including a large number of surface acoustic wave devices, planarization treatment for the insulation layer, wire insulating film and interlayer insulating film can be carried out efficiently.

A second aspect of the invention provides a surface acoustic wave device formed in one chip and including over a semiconductor substrate at least an IC region and a surface acoustic wave element region that are horizontally disposed. The surface acoustic wave device includes a semiconductor element layer including a semiconductor element and an insulation layer in the IC region over the semiconductor substrate. The insulation layer covers the semiconductor element and is deposited also in the surface acoustic wave element region. The device also includes: a wire layer formed over the semiconductor element layer by depositing wires coupled to the semiconductor element and a wire insulating film that provides insulation among the wires and is deposited also in the surface acoustic wave element region; an interlayer insulating film formed on the wire insulating film in the IC region and the surface acoustic wave element region, and having a flattened surface; a piezoelectric thin film formed on the interlayer insulating film; and a surface acoustic wave element formed on the piezoelectric thin film in the surface acoustic wave element region.

According to this configuration, the surface of the interlayer insulating film is flattened, and thus the piezoelectric thin film can be formed on the interlayer insulating film with keeping the flat state. Thus, the surface acoustic wave element including IDT electrodes can be formed on the piezoelectric thin film with favorable size accuracy, which can offer a surface acoustic wave device involving no variation in the resonant frequency and having favorable characteristics. Furthermore, the planarization of surface of the interlayer insulating film also leads to an advantage of enhancing the crystal orientation of the piezoelectric thin film, and thus offering a large electromechanical coupling coefficient $K^2$.

In the surface acoustic wave device according to the second aspect, it is preferable that at least one layer-thickness adjusting film is formed on any of the semiconductor substrate, the insulation layer, and the wire insulating film in the surface acoustic wave element region.

According to this configuration, the layer-thickness adjusting film is adequately provided on any of the semiconductor substrate, the insulation layer and the wire insulating film in the surface acoustic wave element region. Thus, the height of the step between the IC region and surface acoustic wave element region can be reduced, and therefore the planarization of the interlayer insulating film by planarization treatment can be facilitated. Thus, the surface acoustic wave element can be formed with favorable size accuracy, which can offer a surface acoustic wave device involving no variation in the resonant frequency and having favorable characteristics.

In the surface acoustic wave device according to the second aspect, it is preferable that the layer-thickness adjusting film is included below the surface acoustic wave element, and is formed to have such a position and an area that a region in which the layer-thickness adjusting film is formed includes a region obtained by projecting, in a thickness direction of the surface acoustic wave device, a region in which the surface acoustic wave element is formed.

According to this configuration, the layer-thickness adjusting film is formed below the surface acoustic wave element to have such its position and area as to encompass the region in which the surface acoustic wave element is formed. Thus, the height of the step due to the part on which the surface acoustic wave element is formed is reduced, which can form a surface having favorable flatness. Thus, the surface acoustic wave element can be formed with favorable size accuracy, which can offer a surface acoustic wave device involving no variation in the resonant frequency and having favorable characteristics.

A third aspect of the invention provides a method of manufacturing a surface acoustic wave device formed in one chip and including over a semiconductor substrate at least an IC region and a surface acoustic wave element region that is disposed above the IC region. The method includes: forming in the IC region over the semiconductor substrate a semiconductor element layer that includes a semiconductor element and an insulation layer covering the semiconductor element; forming over the semiconductor element layer a wire layer that includes a plurality of wires coupled to the semiconductor element and a wire insulating film deposited over the plurality of wires to provide insulation among the wires; forming on the wire layer an interlayer insulating film having a flattened surface; forming a piezoelectric thin film on the interlayer insulating film; and forming a surface acoustic wave element on the piezoelectric thin film in the surface acoustic wave element region.

According to the method of manufacturing a surface acoustic wave device, the surface of the interlayer insulating film is flattened, and thus the piezoelectric thin film can be formed on the interlayer insulating film with keeping the flat state. Thus, the surface acoustic wave element including IDT electrodes can be formed on the piezoelectric thin film with favorable size accuracy, which can offer a surface acoustic wave device involving no variation in the resonant frequency and having favorable characteristics. Furthermore, the planarization of surface of the interlayer insulating film also leads to an advantage of enhancing the crystal orientation of the piezoelectric thin film, and thus offering a large electromechanical coupling coefficient $K^2$.

In the method of manufacturing a surface acoustic wave device according to the third aspect, it is preferable that the forming an interlayer insulating film having a flattened surface is carried out by implementing CMP treatment for a surface of an interlayer insulating film after forming the interlayer insulating film.

According to the method of manufacturing a surface acoustic wave device, the surface of the interlayer insulating film is flattened by CMP treatment, and thus the piezoelectric thin film can be formed on the interlayer insulating film with keeping the flat state. Thus, the surface acoustic wave element including IDT electrodes can be formed on the piezoelectric thin film with favorable size accuracy, which can offer a surface acoustic wave device involving no variation in the resonant frequency and having favorable characteristics.

In the method of manufacturing a surface acoustic wave device according to the third aspect, the forming an interlayer insulating film having a flattened surface may be carried out by forming an SOG film.

According to the method of manufacturing a surface acoustic wave device, an interlayer insulating film having a flattened surface can easily be obtained by using an SOG (Spin On Glass) film as the interlayer insulating film. This SOG film is obtained by rotary-applying a liquid SOG material by spin-coating and then baking the material at a high temperature.

The method of manufacturing a surface acoustic wave device according to the third aspect may further include implementing CMP treatment for surfaces of the insulation layer and the wire insulating film after forming the insulation layer and the wire insulating film, or forming an SOG film as the insulation layer and the wire insulating film.

According to the method of manufacturing a surface acoustic wave device, if there is a need to form multi-layers in a wire layer in particular, by adequately implementing CMP treatment or forming an SOG film for the insulation layer and wire insulating film in the IC region and surface acoustic wave element region, the height of the step between the IC region and surface acoustic wave element region can be reduced. Thus, the planarization of the interlayer insulating film can be facilitated.

In the method of manufacturing a surface acoustic wave device according to the third aspect, it is preferable that CMP treatment is implemented or an SOG film is formed for a not-yet-diced wafer including a large number of the surface acoustic wave devices.

According to the method of manufacturing a surface acoustic wave device, by implementing CMP treatment or forming an SOG film for a not-yet-diced wafer including a large number of surface acoustic wave devices, planarization treatment for the insulation layer, wire insulating film and interlayer insulating film can be carried out efficiently.

A fourth aspect of the invention provides a surface acoustic wave device formed in one chip and including over a semiconductor substrate at least an IC region and a surface acoustic wave element region that is disposed above the IC region. The surface acoustic wave device includes: a semiconductor element layer that includes a semiconductor element and an insulation layer covering the semiconductor element in the IC region on the semiconductor substrate; a wire layer formed over the semiconductor element layer by depositing wires coupled to the semiconductor element and a wire insulating film for providing insulation among the wires; an interlayer insulating film formed on the wire insulating film in the IC region, and having a flattened surface; a piezoelectric thin film formed on the interlayer insulating film; and a surface acoustic wave element formed on the piezoelectric thin film in the surface acoustic wave element region.

According to this configuration, the surface of the interlayer insulating film is flattened, and thus the piezoelectric thin film can be formed on the interlayer insulating film with keeping the flat state. Thus, the surface acoustic wave element including IDT electrodes can be formed on the piezoelectric thin film with favorable size accuracy, which can offer a surface acoustic wave device involving no variation in the resonant frequency and having favorable characteristics. Furthermore, the planarization of surface of the interlayer insulating film also leads to an advantage of enhancing the crystal orientation of the piezoelectric thin film, and thus offering a large electromechanical coupling coefficient $K^2$.

Moreover, since the surface acoustic wave element region is provided above the IC region, the chip area can be reduced compared with the case of arranging them horizontally, which allows miniaturization of the surface acoustic wave device.

In addition, such a structure shortens the length of wires coupling the IC region with the surface acoustic wave element region, and therefore enhancement of high frequency characteristics can be expected.

BRIEF DESCRIPTION OF THE DRAWINGS

The invention will be described with reference to the accompanying drawings, wherein like numbers refer to like elements.

DESCRIPTION OF EXEMPLARY EMBODIMENTS

Embodiments of the present invention will be described below with reference to the drawings.

First Embodiment

Prior to description of a method of manufacturing a surface acoustic wave device according to an embodiment of the present invention, description will be made about outline of a semiconductor wafer used in the manufacturing process and a surface acoustic wave device.

Figure 1A:
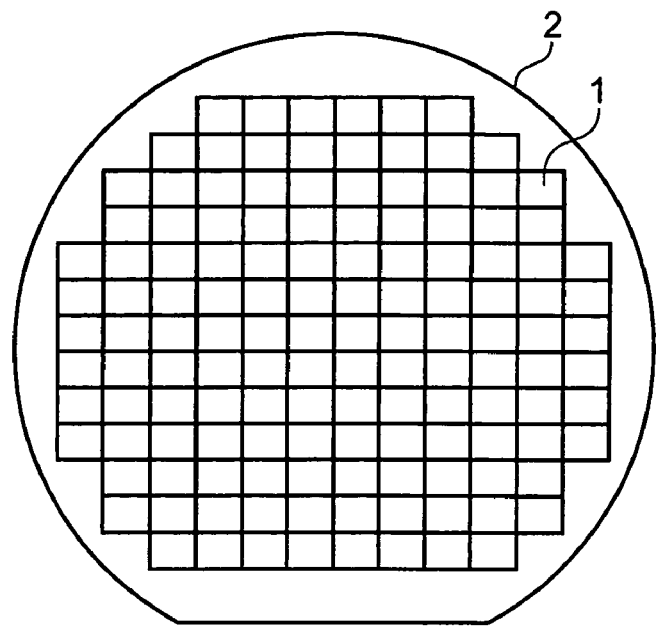
FIG. 1A is a schematic plan view of a semiconductor wafer used in manufacturing of a surface acoustic wave device.
Figure 1B:
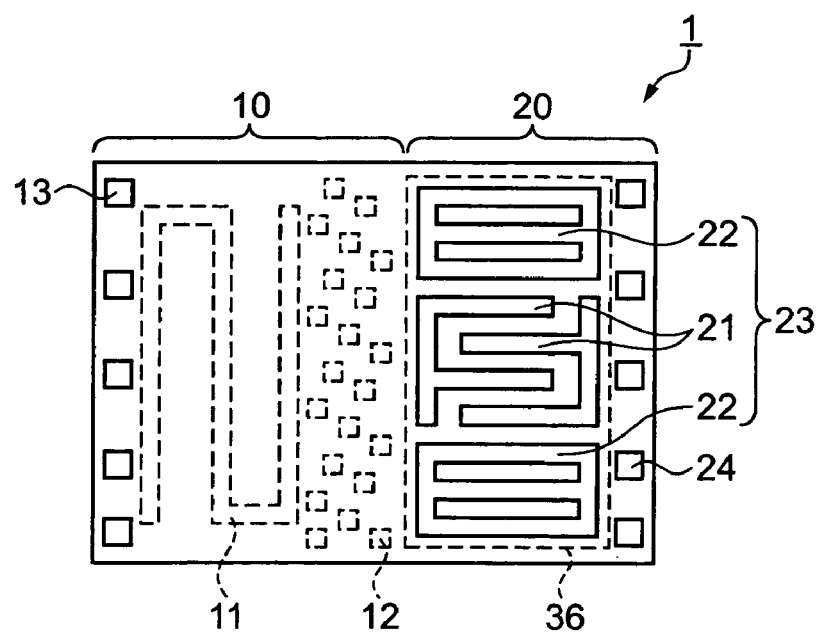
FIG. 1B is a schematic plan view of the surface acoustic wave device.

FIG. 1A is a schematic plan view of a semiconductor wafer used in the manufacturing of a surface acoustic wave device. FIG. 1B is a schematic plan view of the surface acoustic wave device.

In a method of manufacturing a surface acoustic wave device according to an embodiment of the present invention, a large number of surface acoustic wave devices 1 are formed on a semiconductor wafer 2 as a semiconductor substrate, and the manufacturing of the surface acoustic wave devices 1 proceeds on the not-yet-diced semiconductor wafer 2.

One surface acoustic wave device 1 includes an IC region 10 and a surface acoustic wave element region 20 that are horizontally arranged, and an IC and a surface acoustic wave element are electrically coupled to each other to thereby construct a one-chip device. In the IC region 10, a semiconductor element (shown in FIG. 2) is formed and an Al wire 11 is deposited, which provides a similar structure to that of a typical IC. Formed in the surface acoustic wave element region 20 is a SAW resonator as a surface acoustic wave element 23 that includes IDT electrodes 21 of a comb-teeth shape and reflectors 22.

Description will be made as to manufacturing steps for the above-described surface acoustic wave device formed in one chip by disposing an IC region and a surface acoustic wave element region horizontally.

FIGS. 2A to 2C, 3A to 3C, 4A and 4B are partial sectional views schematically illustrating manufacturing steps for a surface acoustic wave device, and the manufacturing process proceeds in the order from FIG. 2A to FIG. 4B.

Figure 2A:
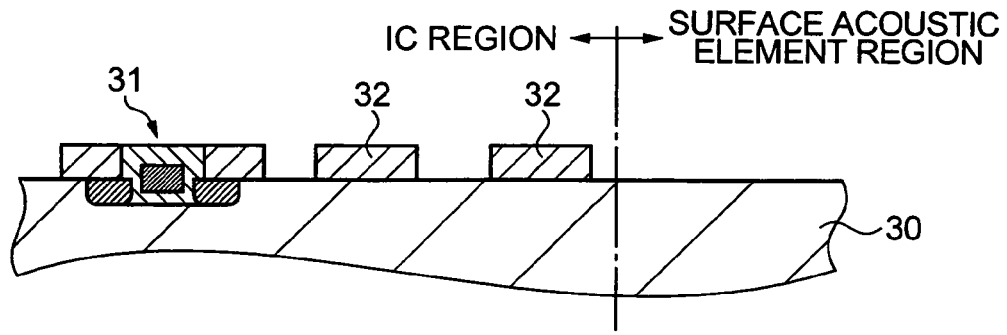
FIGS. 2A, 2B and 2C are partial sectional views schematically illustrating manufacturing steps for a surface acoustic wave device according to a first embodiment of the invention.

Referring to FIG. 2A, a large number of semiconductor elements 31 are formed by a known method in IC regions over a semiconductor substrate 30 composed of silicon. In addition, a large number of Al dummy films 32 are formed near the boundaries between the IC regions and surface acoustic wave element regions over the semiconductor substrate 30, to thereby adjust wire density.

Figure 2B:
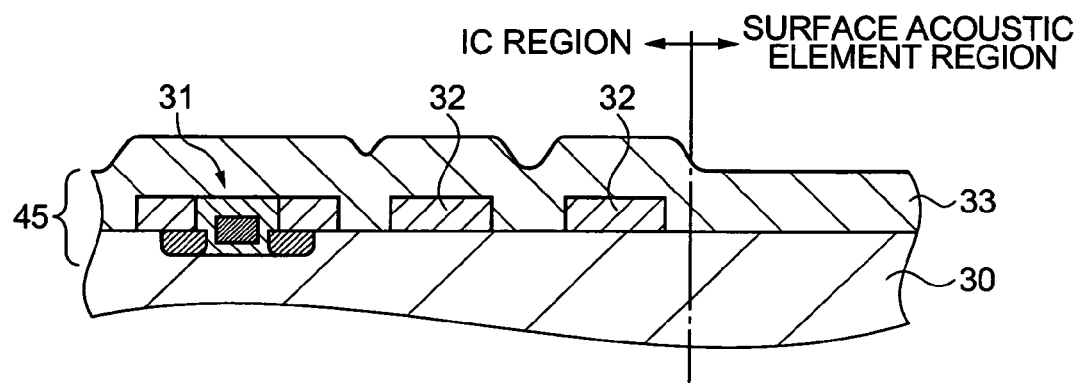

Subsequently, as shown in FIG. 2B, an insulation layer 33 composed of $SiO_2$ is formed on the semiconductor substrate 30 so as to insulate the semiconductor element 31. At this time, the insulation layer 33 is formed not only in the IC region but also in the surface acoustic wave element region.

In this manner, a semiconductor element layer 45 composed of the semiconductor element 31 and the insulation layer 33 is formed in the IC region.

Since the insulation layer 33 has a uniform thickness and is formed by a method such as sputtering, steps arise between the parts under which the semiconductor element 31 and the Al dummy films 32 have been formed and the parts not having them thereunder.

Figure 2C:
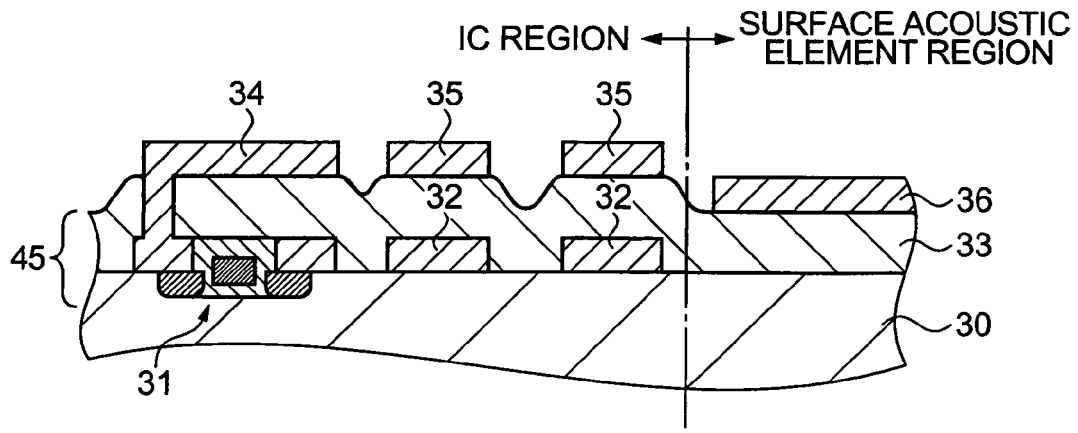

Subsequently, as shown in FIG. 2C, part of the insulation layer 33 on the semiconductor element 31 in the IC region is removed by etching, and then the resultant hole is filled with Al, to form an Al wire 34 electrically coupled to the semiconductor element 31. Simultaneously with the forming of the Al wire 34, Al dummy films 35 are also formed. Furthermore, a layer-thickness adjusting film 36 is formed in the surface acoustic wave element region simultaneously with the Al wire 34 and the Al dummy films 35. As shown in FIG. 1B, the layer-thickness adjusting film 36 is located below the surface acoustic wave element 23 which will be formed in a step to be described later and includes the IDT electrodes 21 and the reflectors 22. Moreover, the layer-thickness adjusting film 36 is formed to have such its position and area that the region in which the layer-thickness adjusting film 36 is formed includes the region obtained by projecting, in the thickness direction of the surface acoustic wave device 1, the region in which the surface acoustic wave element 23 is formed.

Figure 3A:
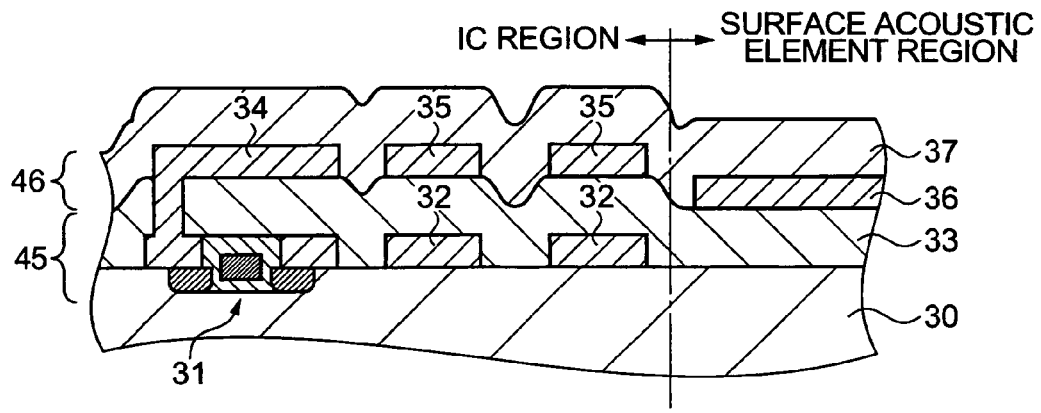
FIGS. 3A, 3B and 3C are partial sectional views schematically illustrating manufacturing steps for a surface acoustic wave device according to the first embodiment.

Then, as shown in FIG. 3A, a wire insulating film 37 made of $SiO_2$ is formed in the IC region and surface acoustic wave element region.

In this manner, a wire layer 46 composed of the Al wire 34 and the wire insulating film 37 is formed in the IC region.

Figure 3B:
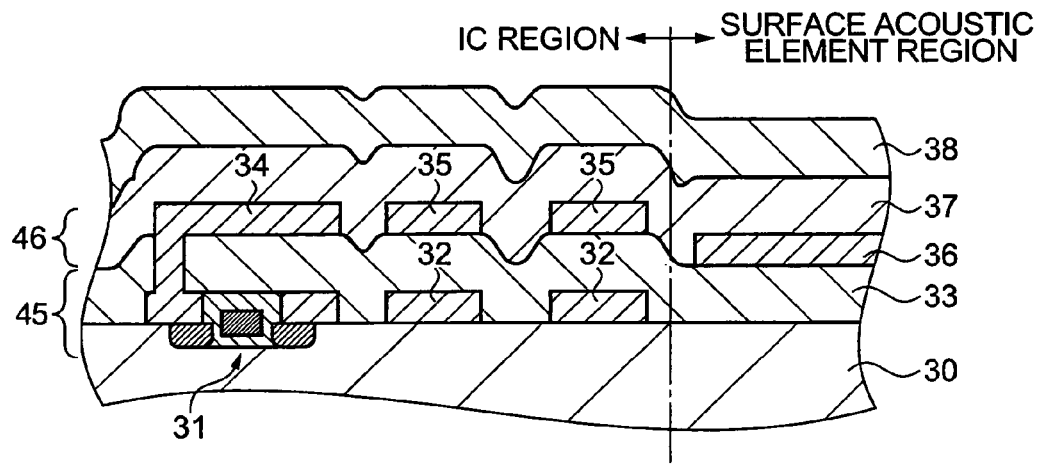

In addition, as shown in FIG. 3B, an interlayer insulating film 38 made of $Si_3N_4$ is formed in the IC region and surface acoustic wave element region, to thereby allow enhancement of the moisture-resistance of the IC.

Figure 3C:
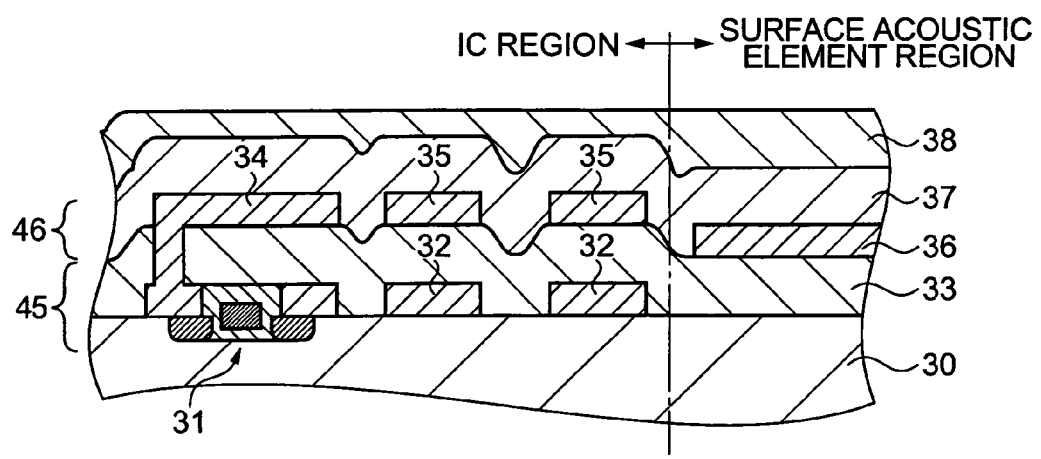

Subsequently, as shown in FIG. 3C, the interlayer insulating film 38 is polished by CMP (Chemical Mechanical Polishing) treatment until it becomes flat across the entire surface of both the IC region and surface acoustic wave element region. At this time, the CMP treatment is carried out for a not-yet-diced wafer. This CMP treatment is a method for planarizing a wafer surface by pressing a polishing pad against the wafer while running on the pad surface a polishing fluid prepared by mixing micro abrasives of silica or the like and a chemical, to thereby polish the wafer mechanically and chemically.

Figure 4A:
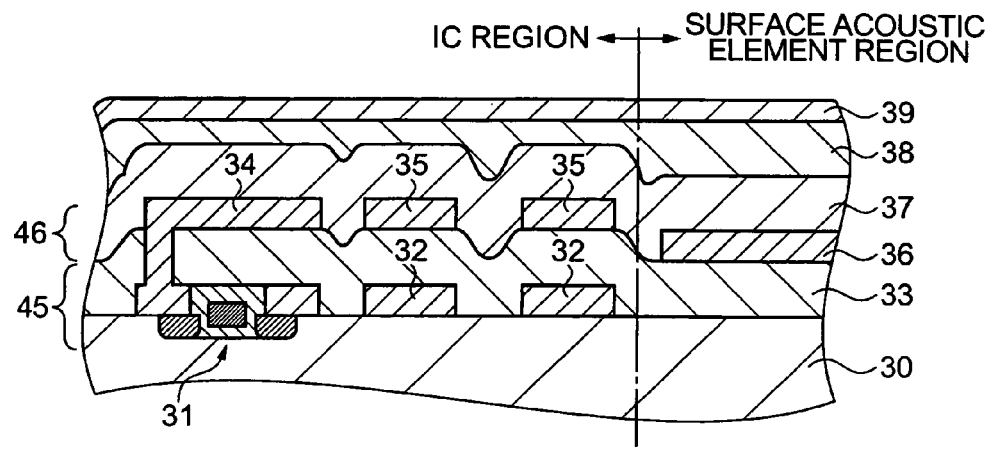
FIGS. 4A and 4B are partial sectional views schematically illustrating manufacturing steps for a surface acoustic wave device according to the first embodiment.

Then, as shown in FIG. 4A, a piezoelectric thin film 39 composed of ZnO is formed on the interlayer insulating film 38 flattened by CMP treatment in the IC region and surface acoustic wave element region.

Figure 4B:
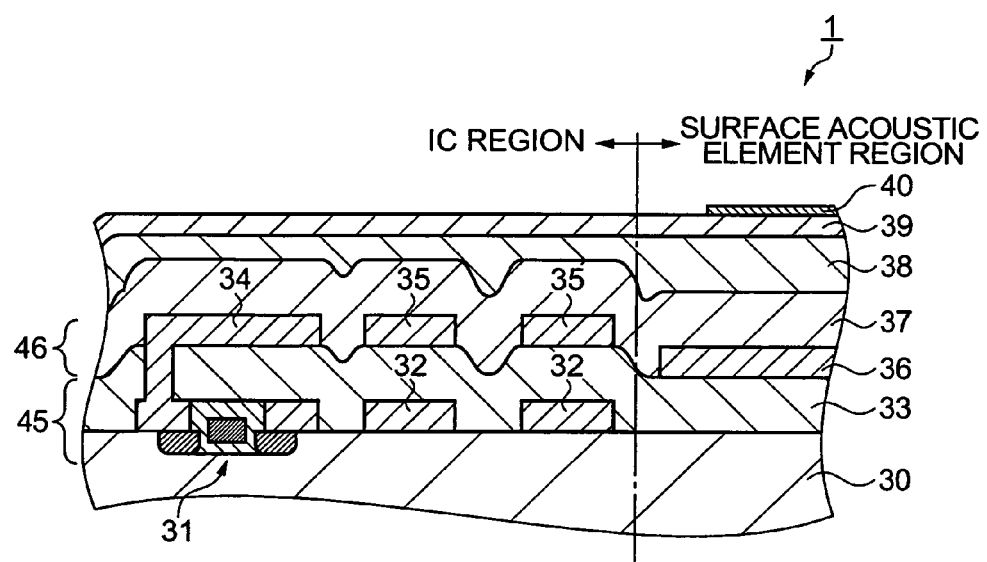

Subsequently, as shown in FIG. 4B, a surface acoustic wave element 40 is formed on the piezoelectric thin film 39 in the surface acoustic wave element region. The surface acoustic wave element 40 is constructed as a SAW resonator including the IDT electrodes 21 and the reflectors 22 shown in FIG. 1B.

In this manner, the surface acoustic wave device 1 formed in one chip by horizontally arranging the IC region and surface acoustic wave element region over the semiconductor substrate 30 can be obtained.

Note that this embodiment can be achieved also by providing the layer-thickness adjusting film 36 on the semiconductor substrate 30 or alternatively on the wire insulating film 37. In addition, an embodiment that includes the piezoelectric thin film 39 only in the surface acoustic wave element region is also available. Moreover, another embodiment is also available in which the provision of the layer-thickness adjusting film 36 is omitted by adequately adjusting the film thicknesses of the insulation layer 33 and the wire insulating film 37.

As described above, according to the method of manufacturing the surface acoustic wave device 1 of the present embodiment, the surface of the interlayer insulating film 38 is flattened by CMP treatment, and thus the piezoelectric thin film 39 can be formed on the interlayer insulating film 38 with keeping the flat state. Thus, the surface acoustic wave element 40 can be formed with favorable size accuracy since it is formed on the flat piezoelectric thin film 39, which can offer the surface acoustic wave device 1 involving no variation in the resonant frequency and having favorable characteristics. Furthermore, the planarization of surface of the interlayer insulating film 38 also leads to an advantage of enhancing the crystal orientation of the piezoelectric thin film 39, and thus offering a large electromechanical coupling coefficient $K^2$ of the surface acoustic wave element 40.

In addition, the layer-thickness adjusting film 36 is adequately provided on the insulation layer 33 or the wire insulating film 37 in the surface acoustic wave element region. Thus, the height of the step between the IC region and surface acoustic wave element region can be reduced, and therefore the planarization of the interlayer insulating film 38 by CMP treatment can be facilitated.

Moreover, the CMP treatment is carried out for a not-yet-diced wafer including thereon a large number of surface acoustic wave devices, which allows efficient CMP treatment.

Furthermore, the layer-thickness adjusting film 36 is formed below the surface acoustic wave element 40 to have such its position and area as to encompass the surface acoustic wave element 40. Thus, the height of the step due to the part on which the surface acoustic wave element 40 is formed is reduced. This step height reduction prevents the step from proceeding over the surface acoustic wave element region with changing to a slope, and thus a surface with favorable flatness can be formed.

In addition, since the layer-thickness adjusting film 36 can be formed in the same step as that of forming the Al wire in the IC region, efficient formation thereof can be achieved.

Second Embodiment

A second embodiment of the invention will be described in which the interlayer insulating film in the first embodiment is formed by using a SOG (Spin On Glass) film. The second embodiment employs the same steps as those of the first embodiment, shown in FIGS. 2A to 3A, until the formation of the wire insulating film 37 in FIG. 3A. Therefore, the description of the steps will be omitted, and steps subsequent to the step of FIG. 3A will be described with reference to FIGS. 5A to 5C. The same members as those in the first embodiment are given the same numerals.

Figure 5A:
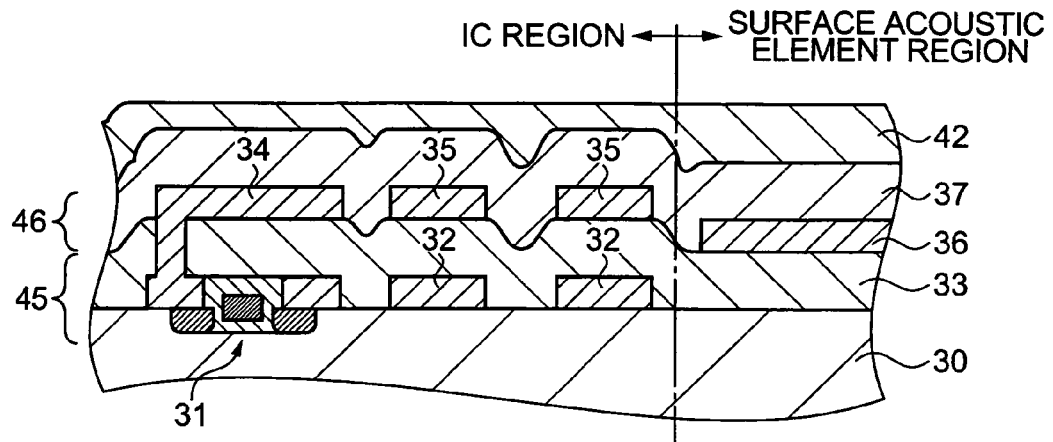
FIGS. 5A, 5B and 5C are partial sectional views schematically illustrating manufacturing steps for a surface acoustic wave device according to a second embodiment of the invention.

Referring to FIG. 5A, an SOG film is provided on the wire insulating film 37 to form an interlayer insulating film 42. The SOG film as the interlayer insulating film 42 is formed by applying on the wire insulating film 37 by spin-coating an inorganic or organic liquid SOG material for example, and then baking the applied material at a high temperature to volatilize the solvent, to thereby cause polymerization reaction of the SOG material. In the forming of the SOG film, the SOG material is applied and baked on a not-yet-diced wafer. At the time of the application, by applying the SOG material on the wire insulating film 37 and carrying out spin-coating, the SOG material flows into the steps on the surface of the wire insulating film 37, which allows formation of the thin and flat interlayer insulating film 42.

Figure 5B:
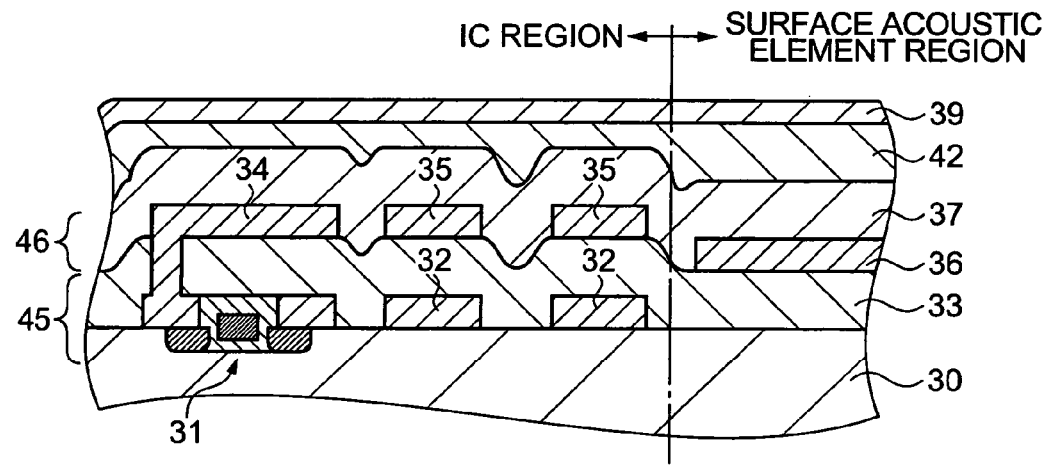

Then, as shown in FIG. 5B, the piezoelectric thin film 39 composed of ZnO is formed on the interlayer insulating film 42 formed of the SOG film in the IC region and surface acoustic wave element region.

Figure 5C:

Subsequently, as shown in FIG. 5C, the surface acoustic wave element 40 including IDT electrodes and reflectors is formed on the piezoelectric thin film 39 in the surface acoustic wave element region. In this manner, the surface acoustic wave device 3 formed in one chip by horizontally arranging the IC region and surface acoustic wave element region over the semiconductor substrate 30 can be obtained.

As described above, forming the interlayer insulating film 42 by using an SOG film is also possible. Using an SOG film can provide the flat interlayer insulating film 42 easily at low costs. In addition, the piezoelectric thin film 39 can be formed on the interlayer insulating film 42 with keeping the flat state, and thus the surface acoustic wave element 40 can be formed with favorable size accuracy. Accordingly, a surface acoustic wave device 3 involving no variation in the resonant frequency and having favorable characteristics can be provided.

Third Embodiment

Description will be made as to a third embodiment of the invention including multi-layered Al wires in a wire layer in an IC region.

FIGS. 6A to 6C, 7A to 7C, 8A, 8B, 9A, 9B, and 10 are partial sectional views schematically illustrating manufacturing steps for a surface acoustic wave device, and the manufacturing process proceeds in the order from FIG. 6A to FIG. 10.

Figure 6A:
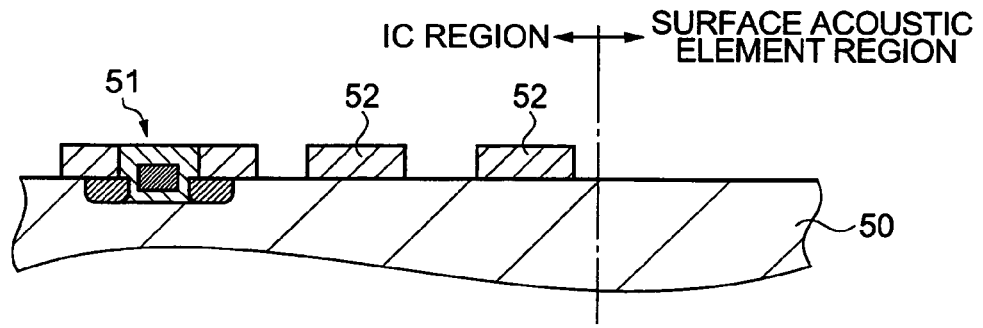
FIGS. 6A, 6B and 6C are partial sectional views schematically illustrating manufacturing steps for a surface acoustic wave device according to a third embodiment of the invention.

Referring to FIG. 6A, a large number of semiconductor elements 51 are formed by a known method in IC regions over a semiconductor substrate 50 composed of silicon. In addition, a large number of Al dummy films 52 are formed near the boundaries between the IC regions and surface acoustic wave element regions over the semiconductor substrate 50, to thereby adjust wire density.

Figure 6B:
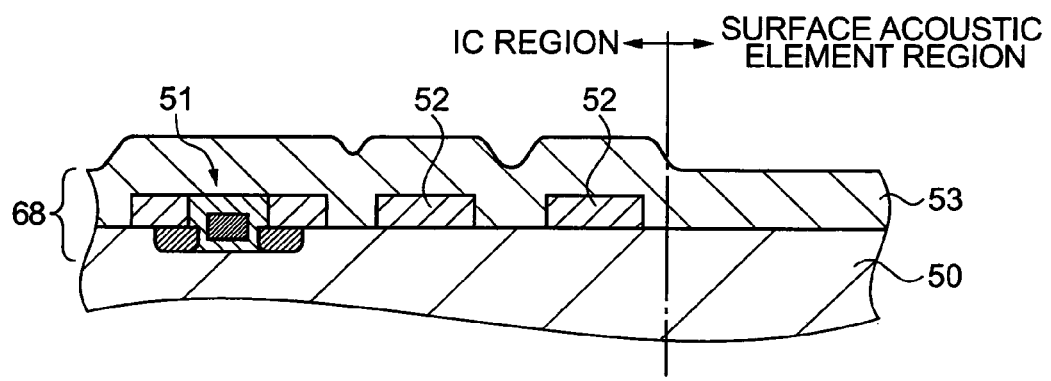

Subsequently, as shown in FIG. 6B, an insulation layer 53 composed of $SiO_2$ is formed on the semiconductor substrate 50. At this time, the insulation layer 53 is formed not only in the IC region but also in the surface acoustic wave element region.

In this manner, a semiconductor element layer 68 composed of the semiconductor element 51 and the insulation layer 53 is formed in the IC region.

Since the insulation layer 53 has a uniform thickness and is formed by a method such as sputtering, steps arise between the parts under which the semiconductor element 51 and the Al dummy films 52 have been formed and the parts not having them thereunder. In particular, a step arises at the boundary between the IC region and surface acoustic wave element region.

Figure 6C:
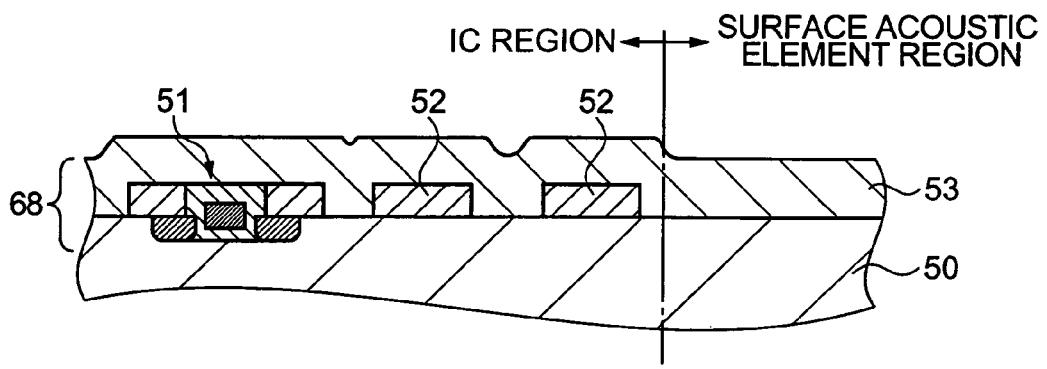

As shown in FIG. 6C, the height of the step can be reduced by polishing the surface of the insulation layer 53 in the IC region by CMP treatment.

Figure 7A:
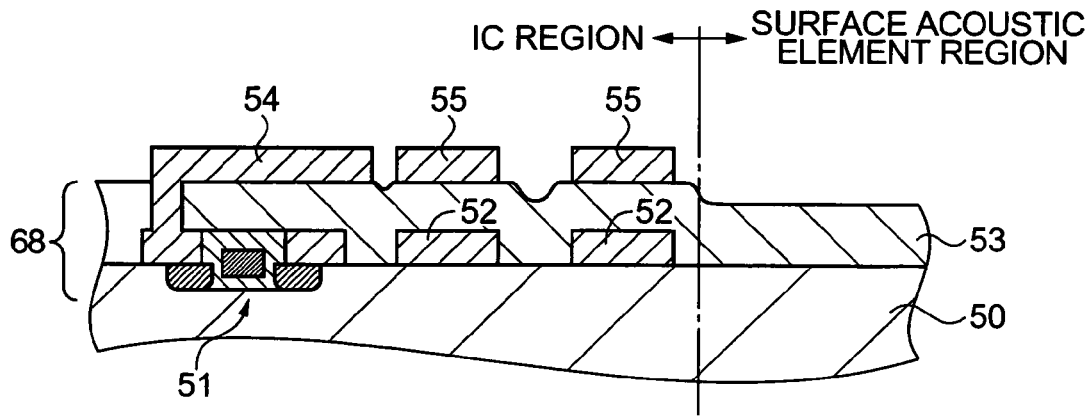
FIGS. 7A, 7B and 7C are partial sectional views schematically illustrating manufacturing steps for a surface acoustic wave device according to the third embodiment.

Subsequently, as shown in FIG. 7A, part of the insulation layer 53 on the semiconductor element 51 in the IC region is removed by etching, and then the resultant hole is filled with Al, to form a first Al wire 54 electrically coupled to the semiconductor element 51. Simultaneously with the forming of the first Al wire 54, Al dummy films 55 are also formed.

Figure 7B:
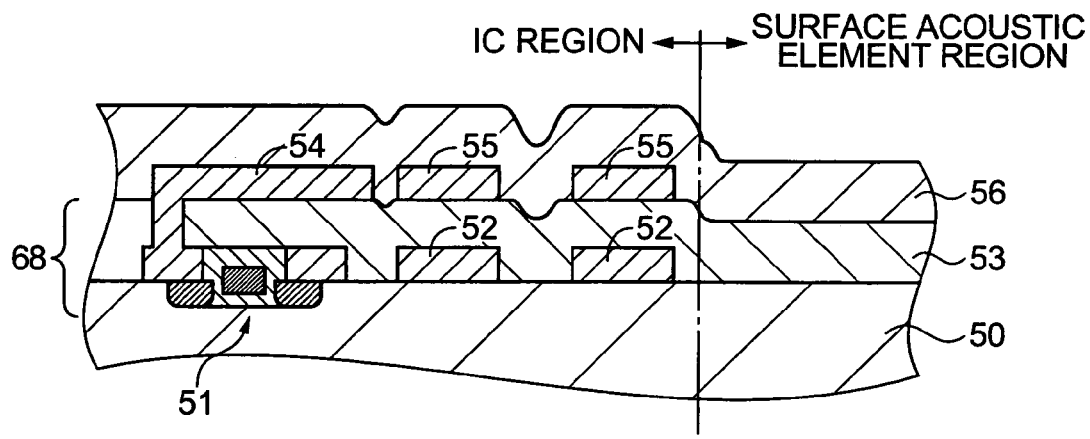

Then, as shown in FIG. 7B, a first wire insulating film 56 made of $SiO_2$ is formed in the IC region and surface acoustic wave element region.

Figure 7C:
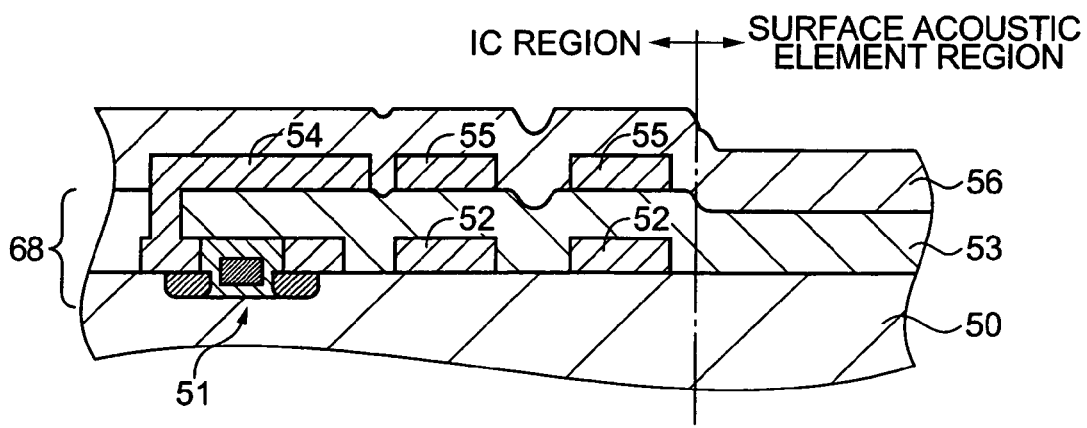

Subsequently, as shown in FIG. 7C, the surface of the first wire insulating film 56 in the IC region is polished by CMP treatment, to thereby reduce the height of the step between the IC region and surface acoustic wave element region.

Figure 8A:
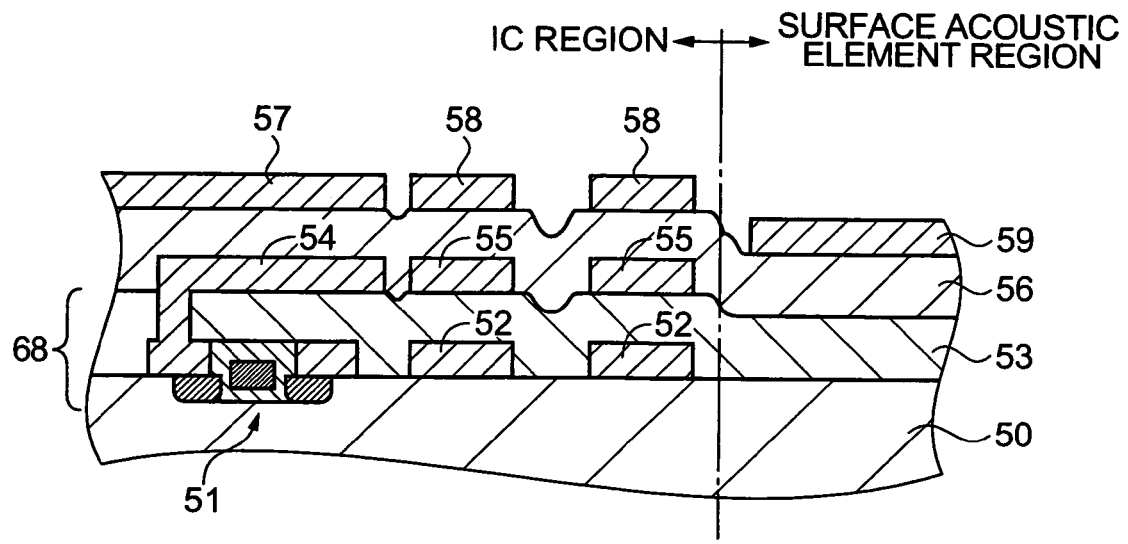
FIGS. 8A and 8B are partial sectional views schematically illustrating manufacturing steps for a surface acoustic wave device according to the third embodiment.

Then, as shown in FIG. 8A, a second Al wire 57 and Al dummy films 58 are formed on the first wire insulating film 56. Furthermore, a layer-thickness adjusting film 59 is formed in the surface acoustic wave element region simultaneously with the second Al wire 57 and the Al dummy films 58. The layer-thickness adjusting film 59 is located below a surface acoustic wave element to be described later including IDT electrodes and reflectors. Moreover, the layer-thickness adjusting film is formed to have such its position and area that the region in which the layer-thickness adjusting film is formed includes the region obtained by projecting, in the thickness direction of the surface acoustic wave device, the region in which the surface acoustic wave element is formed.

Figure 8B:
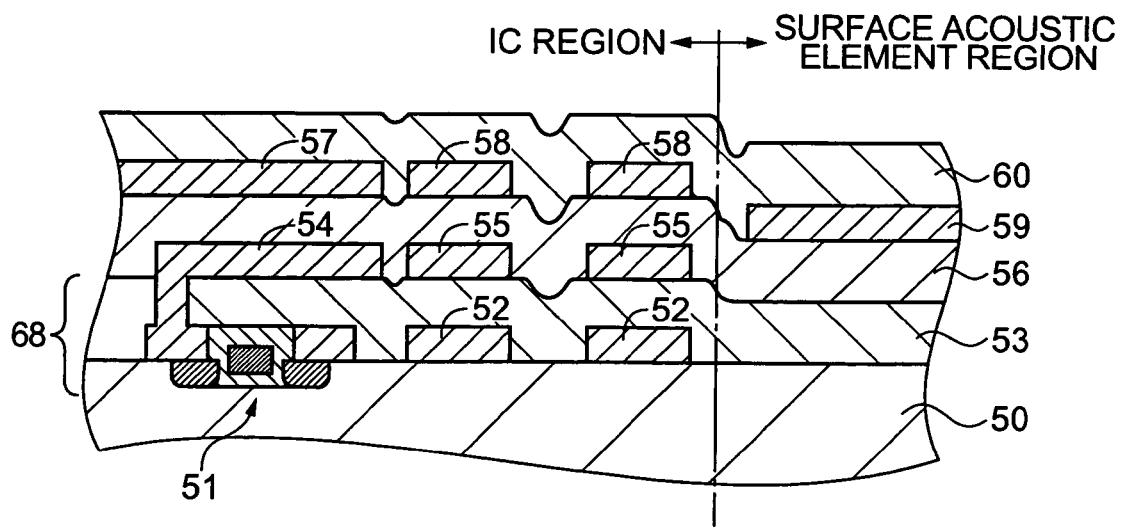

Subsequently, as shown in FIG. 8B, a second wire insulating film 60 made of $SiO_2$ is formed, and thereafter the surface of the second wire insulating film 60 in the IC region is polished by CMP treatment.

Figure 9A:
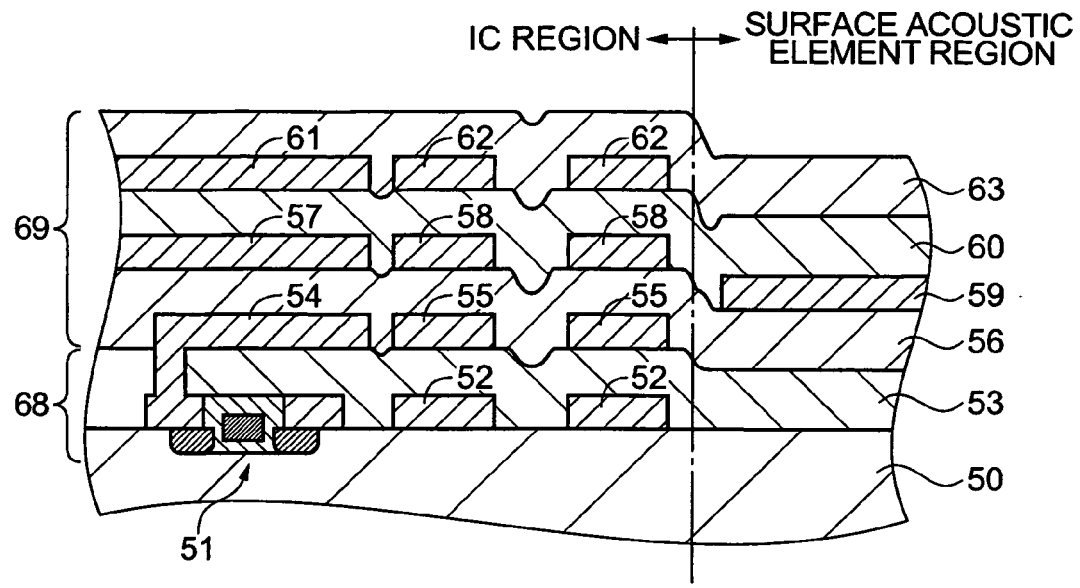
FIGS. 9A and 9B are partial sectional views schematically illustrating manufacturing steps for a surface acoustic wave device according to the third embodiment.

Then, as shown in FIG. 9A, a third Al wire 61 and Al dummy films 62 are formed on the second wire insulating film 60. Thereafter, a third wire insulating film 63 made of $SiO_2$ is formed. Subsequently, the surface of the third wire insulating film 63 in the IC region is polished by CMP treatment, to thereby reduce the height of the step between the IC region and surface acoustic wave element region.

In this manner, a wire layer 69 is formed in the IC region. The wire layer 69 is composed of the first, second and third Al wires 54, 57 and 61, and the first, second and third wire insulating films 56, 60 and 63.

Figure 9B:
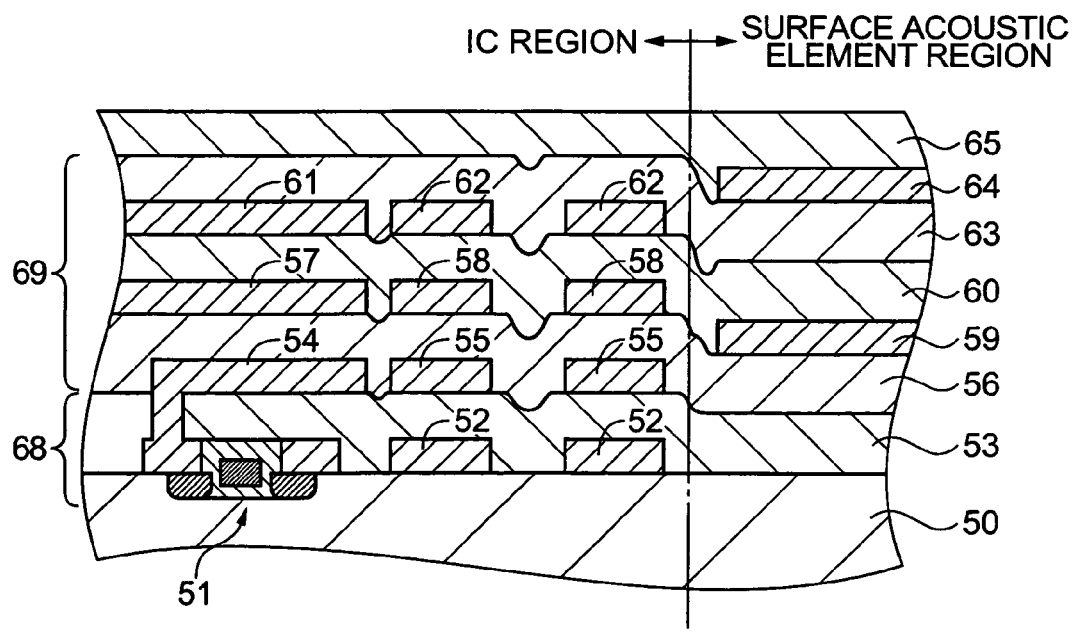

Then, as shown in FIG. 9B, a layer-thickness adjusting film 64 is formed on the third wire insulating film 63 in the surface acoustic wave element region. As with the layer-thickness adjusting film 59, the layer-thickness adjusting film 64 is located below a surface acoustic wave element to be described later including IDT electrodes and reflectors, and is formed to have such its position and area as to encompass the surface acoustic wave element. Subsequently, an interlayer insulating film 65 made of $Si_3N_4$ is formed in the IC region and surface acoustic wave element region, to thereby allow enhancement of the moisture-resistance of the IC. Then, the surface of the interlayer insulating film 65 is polished by CMP treatment until it becomes flat across the entire surface of both the IC region and surface acoustic wave element region.

Note that all the CMP treatment in the present embodiment described above is carried out for a not-yet-diced wafer.

Figure 10:
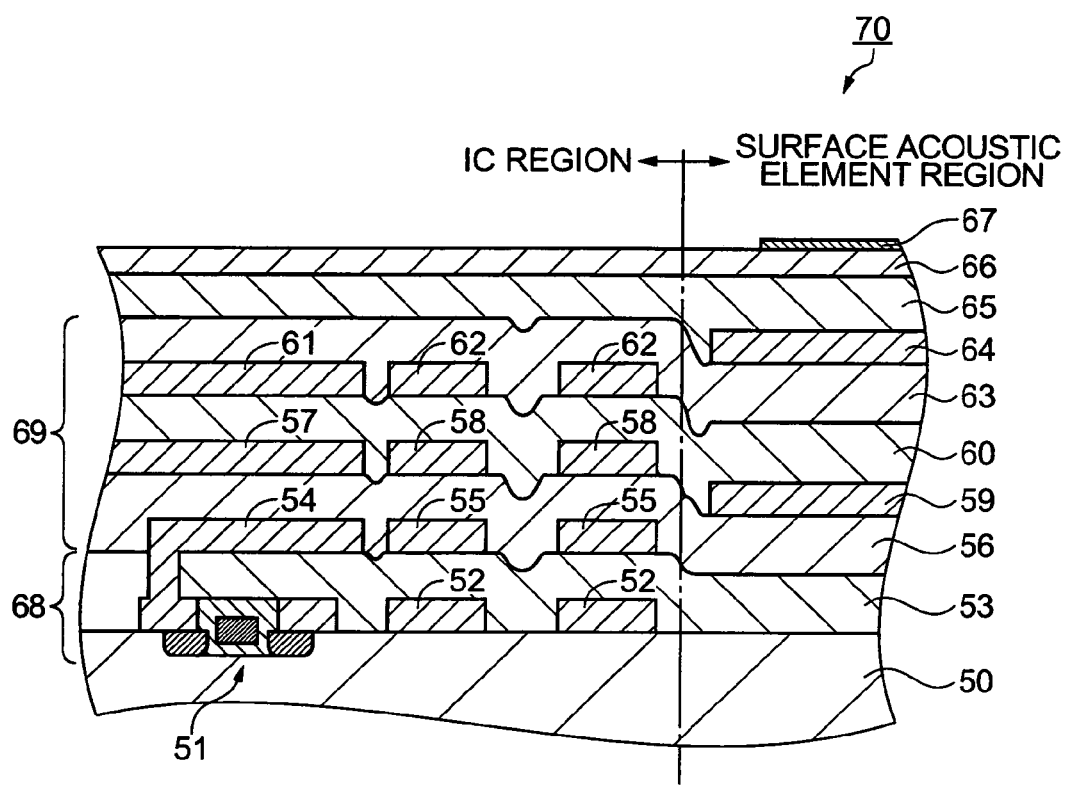
FIG. 10 is a partial sectional view schematically illustrating a manufacturing step for a surface acoustic wave device according to the third embodiment.

Subsequently, as shown in FIG. 10, a piezoelectric thin film 66 composed of ZnO is formed on the interlayer insulating film 65 flattened by CMP treatment in the IC region and surface acoustic wave element region. Thereafter, a surface acoustic wave element 67 is formed on the piezoelectric thin film 66 in the surface acoustic wave element region. The surface acoustic wave element 67 is constructed as a SAW resonator including the IDT electrodes 21 and the reflectors 22 shown in FIG. 1B.

In this manner, a surface acoustic wave device 70 formed in one chip by horizontally arranging the IC region and surface acoustic wave element region over the semiconductor substrate 50 can be obtained.

The layer-thickness adjusting films 59 and 64 may be formed on any of the semiconductor substrate 50, the insulation layer 53, the first wire insulating film 56, the second wire insulating film 60, and the third wire insulating film 63. In addition, adequately forming layer-thickness adjusting films can implement this embodiment regardless of the number of layers in the wire layer.

As described above, according to the method of manufacturing the surface acoustic wave device 70 of the present embodiment, the surface of the interlayer insulating film 65 is flattened by CMP treatment, and thus the piezoelectric thin film 66 can be formed on the interlayer insulating film 65 with keeping the flat state. Thus, the surface acoustic wave element 67 including IDT electrodes can be formed with favorable size accuracy since it is formed on the flat piezoelectric thin film 66, which can offer the surface acoustic wave device 70 involving no variation in the resonant frequency and having favorable characteristics. Furthermore, the planarization of surface of the interlayer insulating film 65 also leads to an advantage of enhancing the crystal orientation of the piezoelectric thin film 66, and thus offering a large electromechanical coupling coefficient $K^2$ of the surface acoustic wave element 67.

In addition, the layer-thickness adjusting films 59 and 64 are adequately provided on any of the insulation layer 53, the first wire insulating film 56, the second wire insulating film 60 and the third wire insulating film 63 in the surface acoustic wave element region. Thus, the height of the step between the IC region and surface acoustic wave element region can be reduced, and therefore the planarization of the interlayer insulating film 65 by CMP treatment can be facilitated.

Furthermore, by implementing CMP treatment for the insulation layer 53, the first wire insulating film 56, the second wire insulating film 60 and the third wire insulating film 63, the height of the step between the IC region and surface acoustic wave element region can be reduced, and thus the planarization of the interlayer insulating film 65 by CMP treatment can be facilitated. When depositing multi-layered Al wires, the CMP treatment for the respective insulating films prevents increase of the height of the step between the IC region and surface acoustic wave element region, and thus provides an advantageous effect for the planarization of the interlayer insulating film 65.

Moreover, the CMP treatment is carried out for a not-yet-diced wafer including thereon a large number of surface acoustic wave devices 70, which allows efficient CMP treatment.

Furthermore, the layer-thickness adjusting films 59 and 64 are formed below the surface acoustic wave element 67 to have such positions and areas as to encompass the surface acoustic wave element 67. Thus, the height of the step due to the part on which the surface acoustic wave element 67 is formed is reduced, which can form a surface having favorable flatness.

In addition, since the layer-thickness adjusting films 59 and 64 can be formed in the same step as that of forming the Al wires in the IC region, efficient formation thereof can be achieved.

Fourth Embodiment

The interlayer insulating film in the third embodiment may be formed of an SOG film. A fourth embodiment of the invention will be described in which the interlayer insulating film in the third embodiment is formed by using an SOG film. The fourth embodiment employs the same steps as those of the third embodiment, shown in FIGS. 6A to 9A, until the formation of the third wire insulating film 63 in FIG. 9A. Therefore, the description of the steps will be omitted, and steps subsequent to the step of FIG. 9A will be described with reference to FIGS. 11A and 11B. The same members as those in the third embodiment are given the same numerals.

Figure 11A:
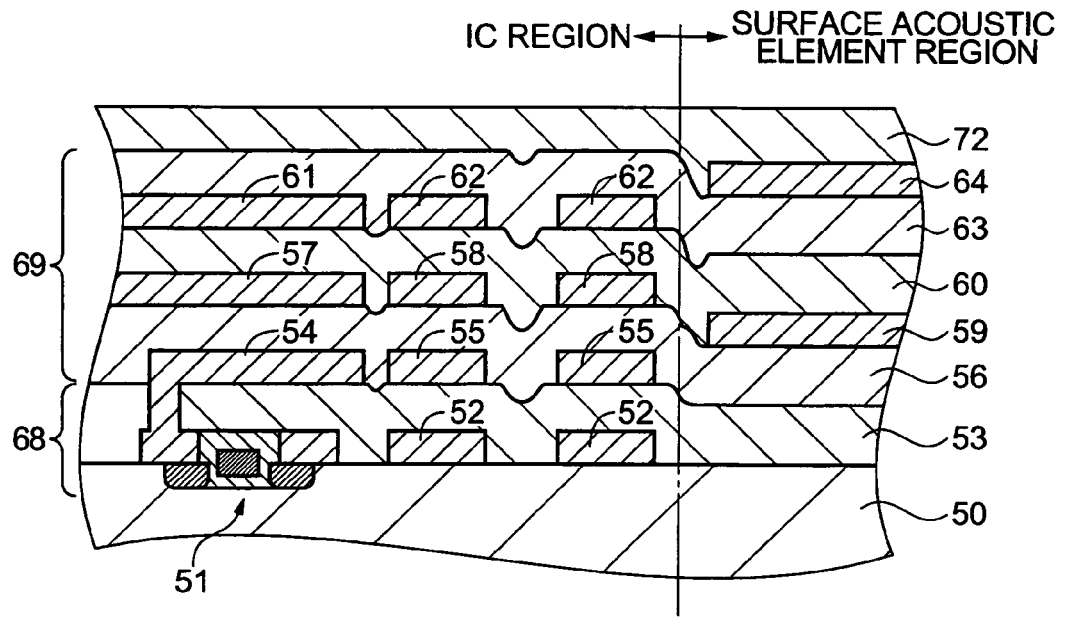
FIGS. 11A and 11B are partial sectional views schematically illustrating manufacturing steps for a surface acoustic wave device according to a fourth embodiment of the invention.

In FIG. 11A, the layer-thickness adjusting film 64 is formed on the third wire insulating film 63 in the surface acoustic wave element region, in order to reduce the height of the step between the IC region and surface acoustic wave element region.

Subsequently, an SOG film is provided on the third wire insulating film 63 to form an interlayer insulating film 72. The SOG film as the interlayer insulating film 72 is formed by applying on the third wire insulating film 63 by spin-coating an inorganic or organic liquid SOG material for example, and then baking the applied material at a high temperature to volatilize the solvent, to thereby cause polymerization reaction of the SOG material. In the forming of the SOG film, the SOG material is applied and baked on a not-yet-diced wafer. At the time of the application, by applying the SOG material on the wire insulating film 63 and carrying out spin-coating, the SOG material flows into the steps on the surface of the third wire insulating film 63, which allows formation of the thin and flat interlayer insulating film 72.

Figure 11B:
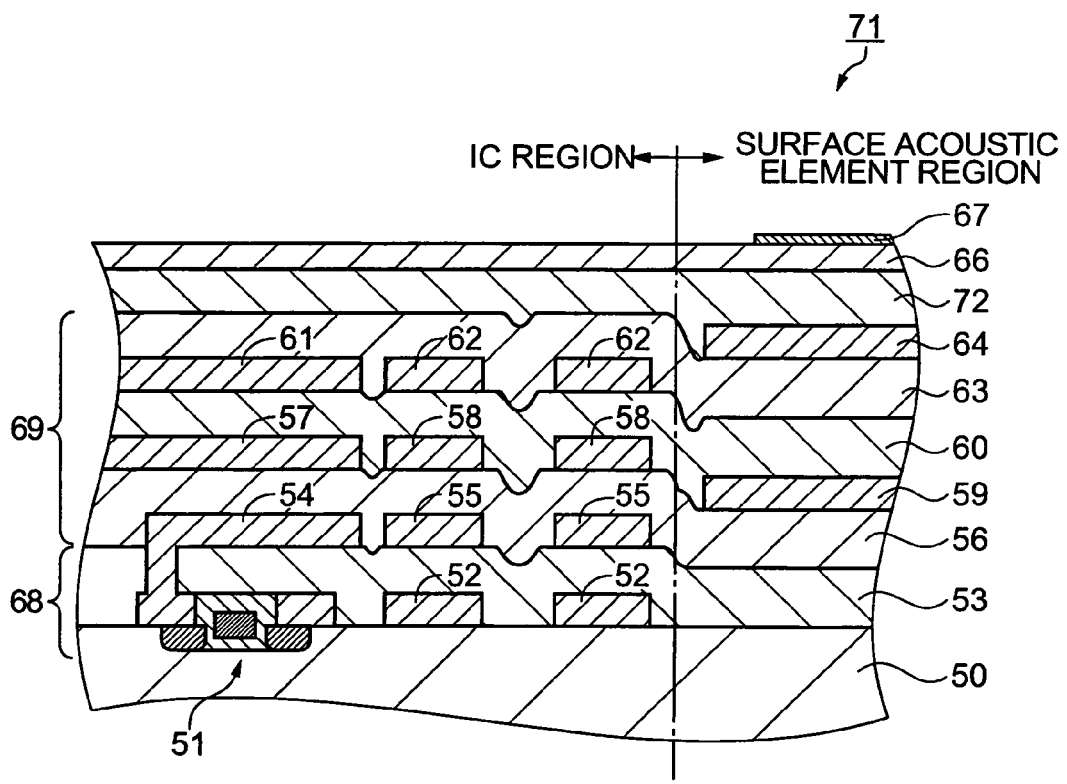

Then, as shown in FIG. 11B, the piezoelectric thin film 66 composed of ZnO is formed on the interlayer insulating film 72 formed of the SOG film in the IC region and surface acoustic wave element region.

Thereafter, a surface acoustic wave element 67 including IDT electrodes and reflectors is formed on the piezoelectric thin film 66 in the surface acoustic wave element region. In this manner, a surface acoustic wave device 71 formed in one chip by horizontally arranging the IC region and surface acoustic wave element region over the semiconductor substrate 50 can be obtained.

As described above, forming the interlayer insulating film 72 by using an SOG film is also possible. Using an SOG film can provide the flat interlayer insulating film 72 easily at low costs. In addition, the piezoelectric thin film 66 can be formed on the interlayer insulating film 72 with keeping the flat state, and thus the surface acoustic wave element 67 can be formed with favorable size accuracy. Accordingly, the surface acoustic wave device 71 involving no variation in the resonant frequency and having favorable characteristics can be provided.

Fifth Embodiment

A surface acoustic wave device according to an embodiment of the invention will be described below. A surface acoustic wave device of the present embodiment is manufacturing by the method of manufacturing a surface acoustic wave device of any of the above-described first to fourth embodiments.

The surface acoustic wave device 1 shown in FIG. 1B includes the IC region 10 and the surface acoustic wave element region 20. In the IC region 10, a semiconductor element is formed on a semiconductor substrate, and deposited thereon is the Al wire 11 coupled to the semiconductor element. Al dummy films 12 are deposited in order to adjust Al wire density. Al pads 13 are provided to offer electrical coupling with the external. In addition, the IC region 10 includes a high frequency circuit such as an oscillation circuit for driving a surface acoustic wave element.

In the surface acoustic wave element region 20, a SAW resonator as the surface acoustic wave element 23 including the IDT electrodes 21 and the reflectors 22 is formed, and Al pads 24 for electrical coupling with the external are provided.

In this manner, the IC region 10 and the surface acoustic wave element region 20 are horizontally arranged and integrated with each other over the semiconductor substrate to construct the surface acoustic wave device 1.

In the surface acoustic wave element region 20, as shown in FIG. 4B for example, the layer-thickness adjusting film 36 is formed on the insulation layer 33 so as to reduce the height of the step between the IC region 10 and the surface acoustic wave element region 20. Furthermore, CMP treatment is carried out for the interlayer insulating film 38, and therefore the entire surface of the IC region 10 and the surface acoustic wave element region 20 is flattened to have no step thereon. Formed on the flattened interlayer insulating film 38 is the piezoelectric thin film 39, on which the surface acoustic wave element 40 is then formed.

The layer-thickness adjusting film 36 is located below the surface acoustic wave element 40 composed of the IDT electrodes 21 and the reflectors 22. Moreover, the layer-thickness adjusting film 36 is formed to have such its position and area that the region in which the layer-thickness adjusting film 36 is formed includes the region obtained by projecting, in the thickness direction of the surface acoustic wave device 1, the region in which the surface acoustic wave element 40 is formed.

As described above, since the surface of the interlayer insulating film 38 of the surface acoustic wave device 1 is flattened, the piezoelectric thin film 39 can be formed on the interlayer insulating film 38 with keeping the flat state. Thus, the surface acoustic wave element 40 including IDT electrodes can be formed on the piezoelectric thin film 39 with favorable size accuracy, which can offer the surface acoustic wave device 1 involving no variation in the resonant frequency and having favorable characteristics. Furthermore, the planarization of surface of the interlayer insulating film 38 also leads to an advantage of enhancing the crystal orientation of the piezoelectric thin film 39, and thus offering a large electromechanical coupling coefficient $K^2$.

In addition, the layer-thickness adjusting film 36 is adequately provided on the insulation layer 33 or the wire insulating film 37 in the surface acoustic wave element region. Thus, the height of the step between the IC region and surface acoustic wave element region can be reduced, and therefore the planarization of the interlayer insulating film 38 by planarization treatment such as CMP treatment can be facilitated.

Furthermore, the layer-thickness adjusting film 36 is formed below the surface acoustic wave element to have such its position and area as to encompass the surface acoustic wave element. Thus, the height of the step due to the part on which the surface acoustic wave element is formed is reduced, which can form a surface having favorable flatness.

Although the above-described embodiment employs the layer-thickness adjusting film formed as a uniform density film, another embodiment is allowed that employs a layer-thickness adjusting film adequately having therein a large number of porosities within the range of having no effect on an electric field of a surface acoustic wave.

Sixth Embodiment

Simple description will be made about a surface acoustic wave device that includes a surface acoustic wave element region above an IC region.

Figure 12A:
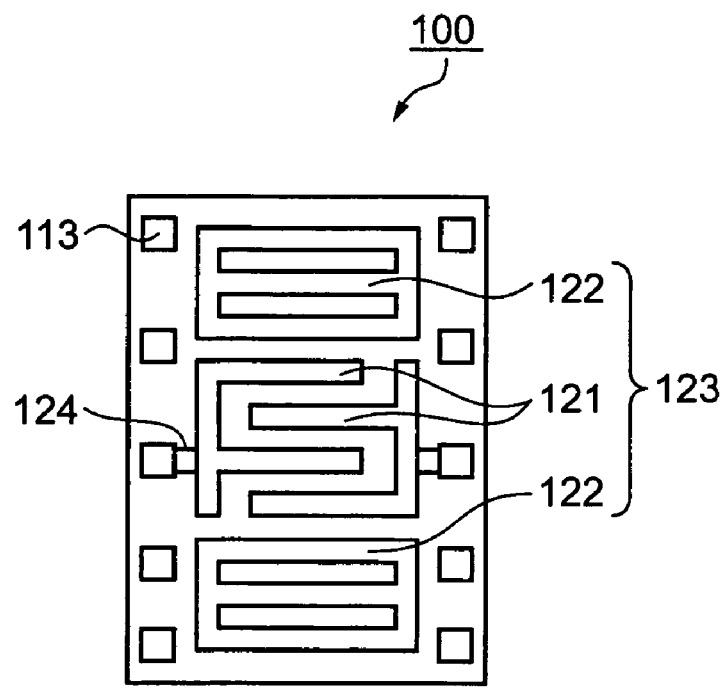
FIG. 12A is a schematic plan view of a surface acoustic wave device according to a sixth embodiment of the invention.
Figure 12B:
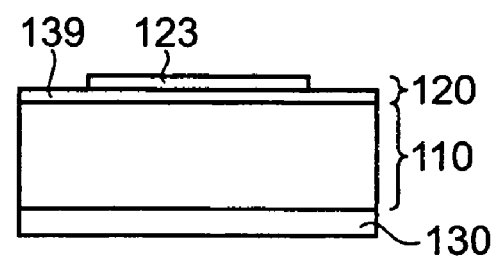
FIG. 12B is a schematic side view of the surface acoustic wave device.

FIG. 12A is a schematic plan view of the surface acoustic wave device. FIG. 12B is a schematic side view thereof.

A surface acoustic wave device 100 includes an IC region 110 in which a semiconductor element and a wire are formed over a semiconductor substrate 130, and a surface acoustic wave element region 120 formed above the IC region 110. The IC and surface acoustic wave element are electrically coupled to each other to construct a one-chip device.

Provided in the surface acoustic wave element region 120 is a piezoelectric thin film 139, and formed thereon is a surface acoustic wave element 123 including IDT electrodes 121 of a comb-teeth shape and reflectors 122. Moreover, in the surface acoustic wave device 100, a plurality of Al pads 113 are disposed, and coupling Al wires 124 extend from part of the Al pads 113 to electrically couple the IDT electrodes 121 with the IC.

Manufacturing steps for the surface acoustic wave device 100 with the above-described configuration will be described below.

FIGS. 13A to 13D, 14A to 14D, and 15 are partial sectional views schematically illustrating manufacturing steps for a surface acoustic wave device, and the manufacturing process proceeds in the order from FIG. 13A to FIG. 15.

Figure 13A:
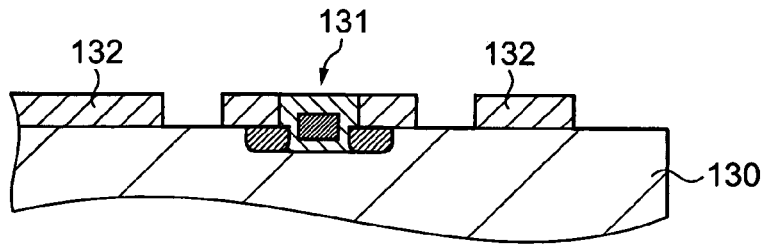
FIGS. 13A to 13D are partial sectional views schematically illustrating manufacturing steps for a surface acoustic wave device according to the sixth embodiment.

Referring to FIG. 13A, a large number of semiconductor elements 131 and Al wires 132 are formed by a known method on the semiconductor substrate 130 made of silicon.

Figure 13B:
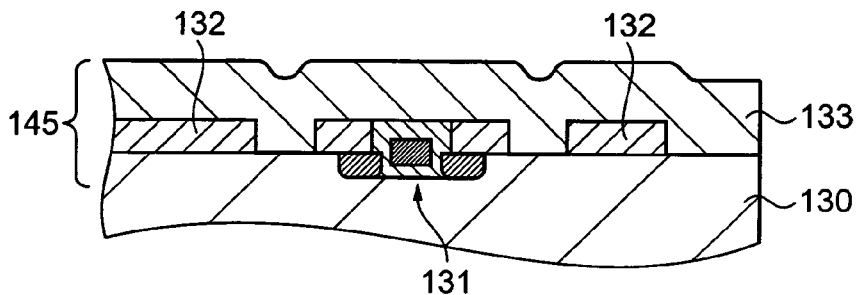

Subsequently, as shown in FIG. 13B, an insulation layer 133 composed of $SiO_2$ is formed on the semiconductor substrate 130 so as to insulate the semiconductor element 131 and the Al wires 132.

In this manner, a semiconductor element layer 145 composed of the semiconductor element 131 and the insulation layer 133 is formed. The insulation layer 133 is formed by sputtering or another method.

Figure 13C:
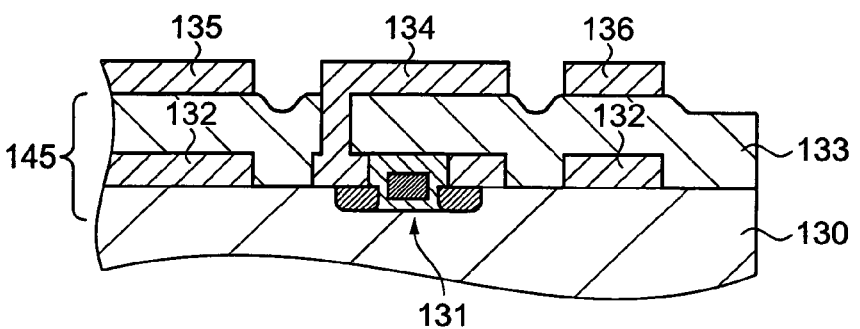

Subsequently, as shown in FIG. 13C, part of the insulation layer 133 on the semiconductor element 131 is removed by etching, and then the resultant hole is filled with Al to form an Al wire 134 electrically coupled to the semiconductor element 131, an Al wire 135, and an Al pad 136.

Figure 13D:
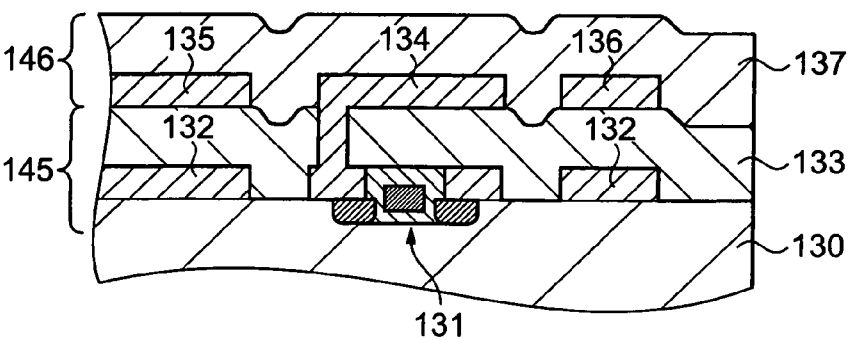

Then, a wire insulating film 137 composed of $SiO_2$ is formed on the Al wires and pads as shown in FIG. 13D.

In this manner, a wire layer 146 composed of the Al wires 134 and 135, the Al pad 136 and the wire insulating film 137 is formed.

Figure 14A:
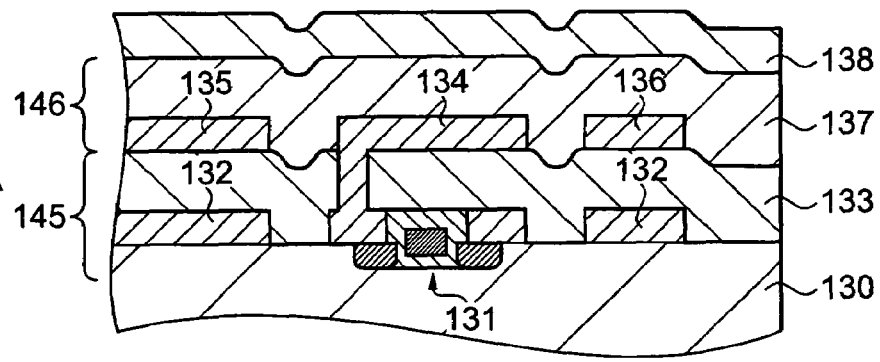
FIGS. 14A to 14D are partial sectional views schematically illustrating manufacturing steps for a surface acoustic wave device according to the sixth embodiment.

Subsequently, as shown in FIG. 14A, an interlayer insulating film 138 composed of $Si_3N_4$ is formed on the wire insulating film 137. The surface of the interlayer insulating film 138 includes thereon steps arising from the presence and absence of the semiconductor element 131 and the Al wires 132, 134 and 135 below the interlayer insulating film 138. This is because the insulation layer 133, the wire insulating film 137 and the interlayer insulating film 138 are formed by a method such as sputtering, which offers a uniform thickness.

Figure 14B:
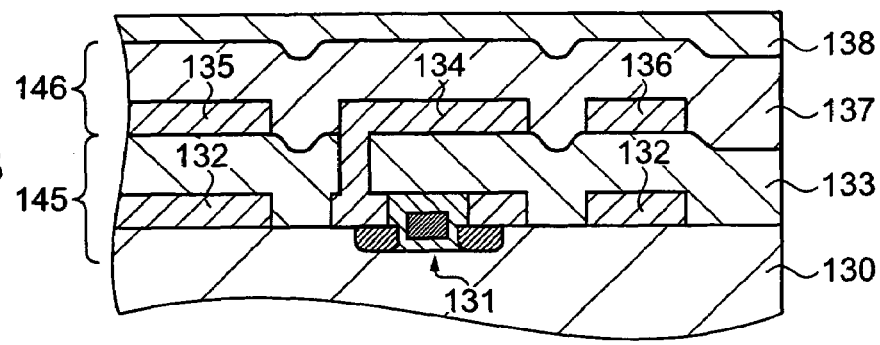

Then, as shown in FIG. 14B, the interlayer insulating film 138 is polished by CMP (Chemical Mechanical Polishing) treatment until it becomes flat. At this time, the CMP treatment is carried out for a not-yet-diced wafer. This CMP treatment is a method for planarizing a wafer surface by pressing a polishing pad against the wafer while running on the pad surface a polishing fluid prepared by mixing micro abrasives of silica or the like and a chemical, to thereby polish the wafer mechanically and chemically.

Figure 14C:
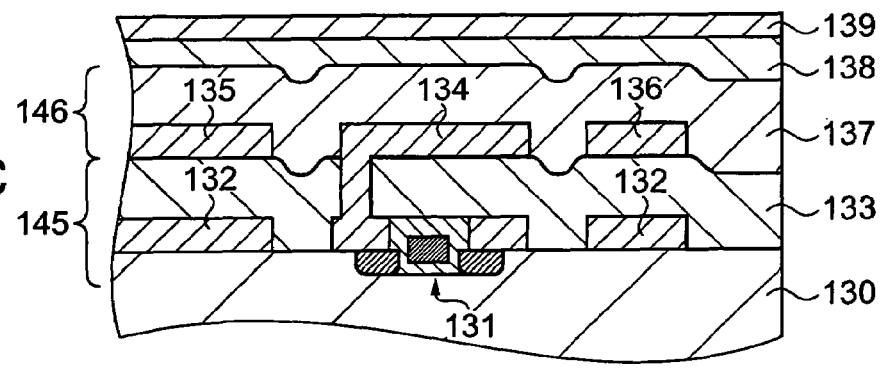

Then, as shown in FIG. 14C, the piezoelectric thin film 139 composed of ZnO is formed on the interlayer insulating film 138 flattened by CMP treatment.

Figure 14D:
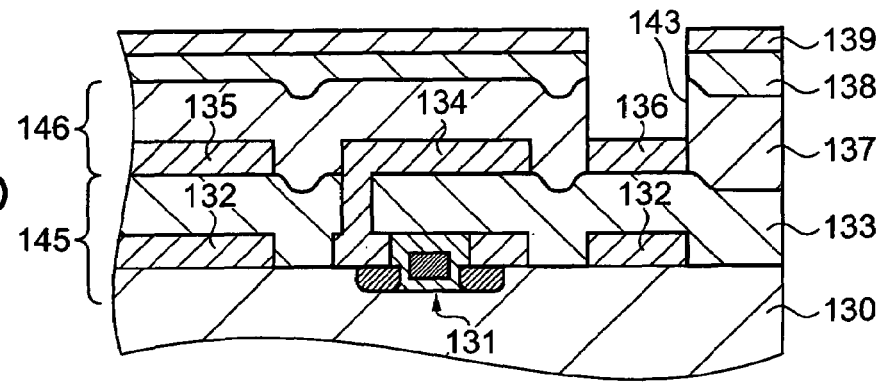

Thereafter, as shown in FIG. 14D, the wire insulating film 137, the interlayer insulating film 138, and the piezoelectric thin film 139 above the Al pad 136 are etched to provide an opening 143.

Figure 15:
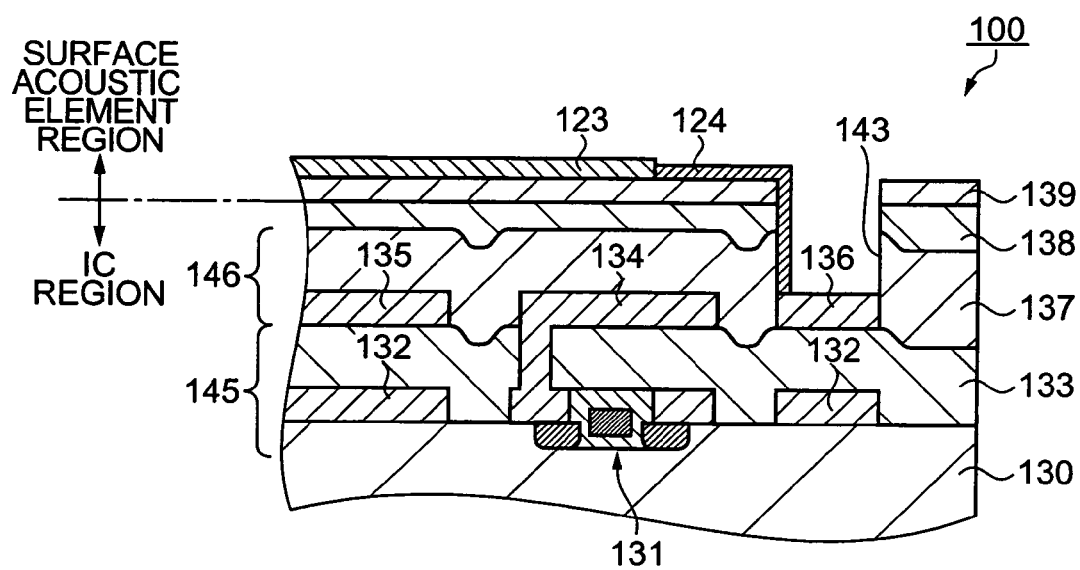
FIG. 15 is a partial sectional view schematically illustrating a manufacturing step for a surface acoustic wave device according to the sixth embodiment.

Subsequently, as shown in FIG. 15, the coupling Al wire 124 is formed to extend from the Al pad 136 and across a sidewall of the opening 143 and the upper face of the piezoelectric thin film 139.

The surface acoustic wave element 123 is then formed on the piezoelectric thin film 139. The surface acoustic wave element 123 is constructed as a SAW resonator including the IDT electrodes 121 and the reflectors 122 shown in FIG. 12A.

In this manner, the surface acoustic wave device 100 formed in one chip by providing the surface acoustic wave element region above the IC region over the semiconductor substrate 130 can be obtained.

As described above, according to the method of manufacturing the surface acoustic wave device 100 of the present embodiment, the surface of the interlayer insulating film 138 is flattened by CMP treatment, and thus the piezoelectric thin film 139 can be formed on the interlayer insulating film 138 with keeping the flat state. Thus, the surface acoustic wave element 123 can be formed with favorable size accuracy since it is formed on the flat piezoelectric thin film 139, which can offer the surface acoustic wave device 100 involving no variation in the resonant frequency and having favorable characteristics. Furthermore, the planarization of surface of the interlayer insulating film 138 also leads to an advantage of enhancing the crystal orientation of the piezoelectric thin film 139, and thus offering a large electromechanical coupling coefficient $K^2$ of the surface acoustic wave element 123. Moreover, the CMP treatment is carried out for a not-yet-diced wafer including thereon a large number of surface acoustic wave devices, which allows efficient CMP treatment.

Seventh Embodiment

A seventh embodiment of the invention will be described in which the interlayer insulating film in the sixth embodiment is formed by using an SOG (Spin On Glass) film. The seventh embodiment employs the same steps as those of the sixth embodiment until the formation of the wire insulating film 137 described for FIG. 13D. Therefore, the description of the steps will be omitted, and steps subsequent to the step of FIG. 13D will be described with reference to FIGS. 16A to 16C. The same members as those in the sixth embodiment are given the same numerals.

Figure 16A:
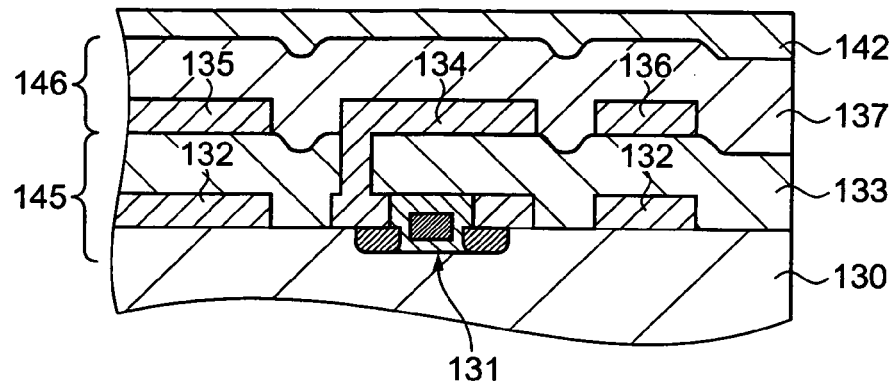
FIGS. 16A, 16B and 16C are partial sectional views schematically illustrating manufacturing steps for a surface acoustic wave device according to a seventh embodiment of the invention.

Referring to FIG. 16A, an SOG film is provided on the wire insulating film 137 to form an interlayer insulating film 142. The SOG film as the interlayer insulating film 142 is formed by applying on the wire insulating film 137 by spin-coating an inorganic or organic liquid SOG material for example, and then baking the applied material at a high temperature to volatilize the solvent, to thereby cause polymerization reaction of the SOG material. In the forming of the SOG film, the SOG material is applied and baked on a not-yet-diced wafer. At the time of the application, by applying the SOG material on the wire insulating film 137 and carrying out spin-coating, the SOG material flows into the steps on the surface of the wire insulating film 137, which allows formation of the thin and flat interlayer insulating film 142.

Figure 16B:
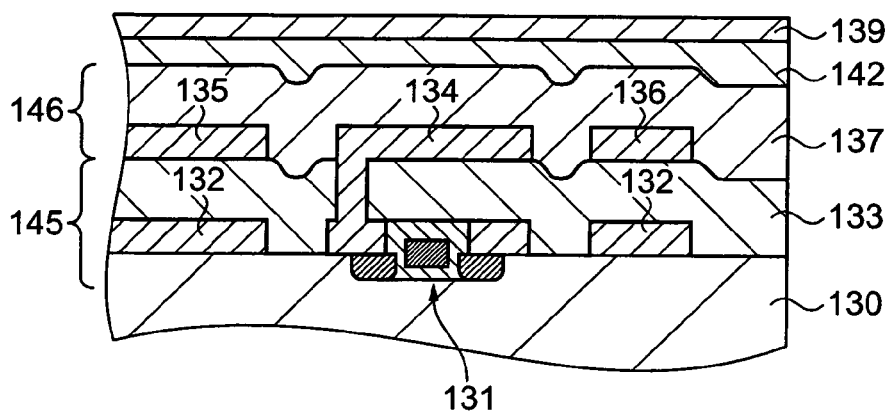

Then, as shown in FIG. 16B, the piezoelectric thin film 139 composed of ZnO is formed on the interlayer insulating film 142 formed of the SOG film.

Figure 16C:
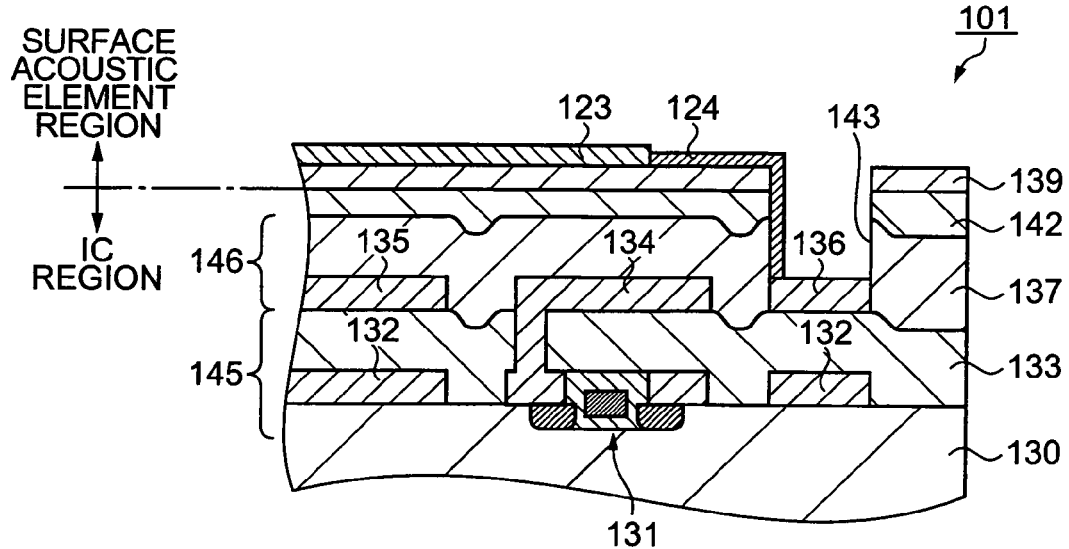

Thereafter, as shown in FIG. 16C, the wire insulating film 137, the interlayer insulating film 142, and the piezoelectric thin film 139 above the Al pad 136 are etched to provide the opening 143. The coupling Al wire 124 is then formed to extend from the Al pad 136 and across a sidewall of the opening 143 and the upper face of the piezoelectric thin film 139.

The surface acoustic wave element 123 is then formed on the piezoelectric thin film 139.

In this manner, a surface acoustic wave device 101 formed in one chip by providing the surface acoustic wave element region above the IC region over the semiconductor substrate 130 can be obtained.

As described above, forming the interlayer insulating film 142 by using an SOG film is also possible. Using an SOG film can provide the flat interlayer insulating film 142 easily at low costs. In addition, the piezoelectric thin film 139 can be formed on the interlayer insulating film 142 with keeping the flat state, and thus the surface acoustic wave element 123 can be formed with favorable size accuracy. Accordingly, the surface acoustic wave device 101 involving no variation in the resonant frequency and having favorable characteristics can be provided.

Eighth Embodiment

Description will be made as to an eighth embodiment of the invention including multi-layered Al wires in a wire layer in an IC region.

FIGS. 17A to 17E, 18A to 18C, 19A to 19C, and 20 are partial sectional views schematically illustrating manufacturing steps for a surface acoustic wave device, and the manufacturing process proceeds in the order from FIG. 17A to FIG. 20.

Figure 17A:
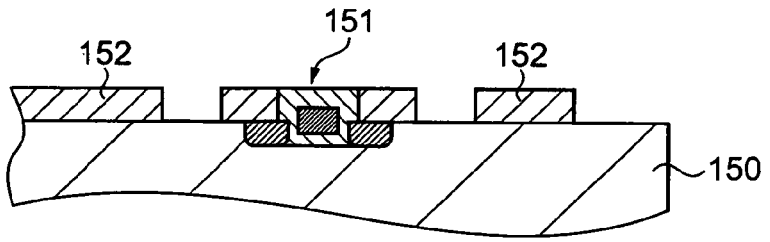
FIGS. 17A to 17E are partial sectional views schematically illustrating manufacturing steps for a surface acoustic wave device according to an eighth embodiment of the invention.

Referring to FIG. 17A, a large number of semiconductor elements 151 and Al wires 152 are formed by a known method on a semiconductor substrate 150 made of silicon.

Figure 17B:
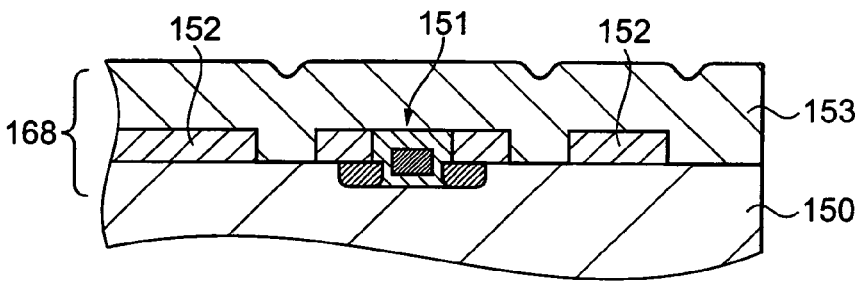

Subsequently, as shown in FIG. 17B, an insulation layer 153 composed of $SiO_2$ is formed on the semiconductor substrate 150.

In this manner, a semiconductor element layer 168 composed of the semiconductor element 151 and the insulation layer 153 is formed.

Since the insulation layer 153 has a uniform thickness and is formed by a method such as sputtering, steps arise between the parts under which the semiconductor element 151 and the Al wires 152 have been formed and the parts not having them thereunder.

Figure 17C:
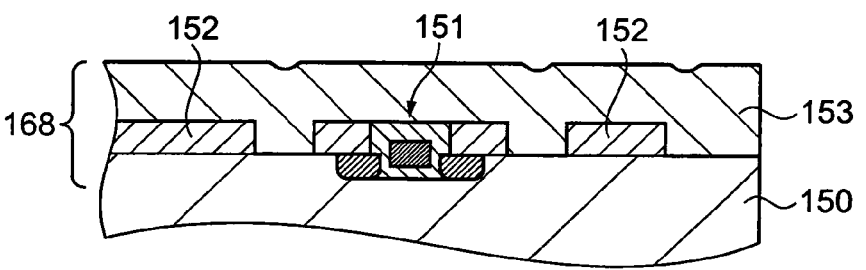

Subsequently, as shown in FIG. 17C, the surface of the insulation layer 153 is polished by CMP treatment. This polishing can reduce the heights of the steps.

Figure 17D:
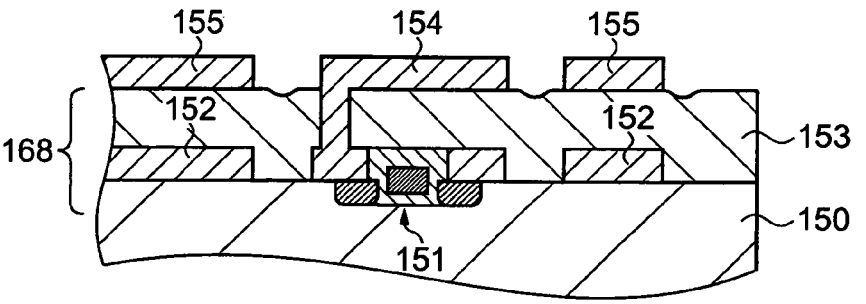

Subsequently, as shown in FIG. 17D, part of the insulation layer 153 on the semiconductor element 151 is removed by etching, and then the resultant hole is filled with Al, to form first Al wires 154 and 155.

Figure 17E:
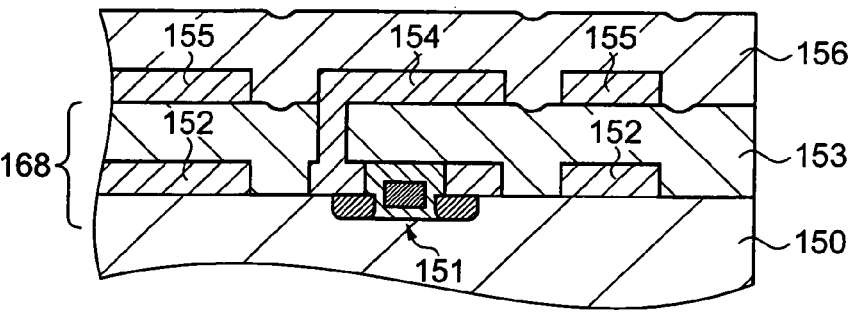

Then, as shown in FIG. 17E, a first wire insulating film 156 made of $SiO_2$ is formed.

Figure 18A:
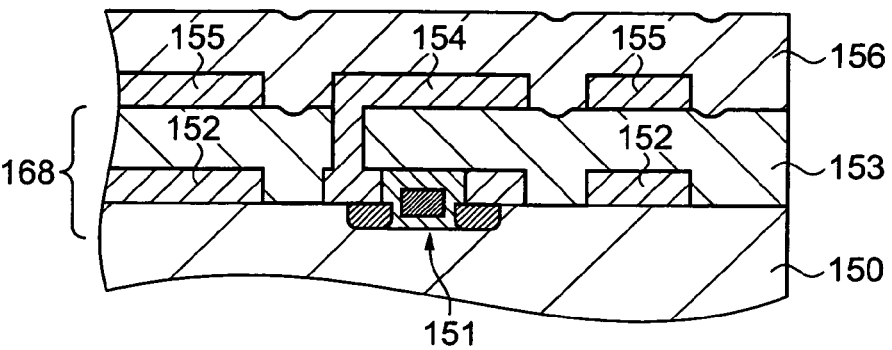
FIGS. 18A, 18B and 18C are partial sectional views schematically illustrating manufacturing steps for a surface acoustic wave device according to the eighth embodiment.

Subsequently, as shown in FIG. 18A, the surface of the first wire insulating film 156 is polished by CMP treatment, to thereby reduce the heights of the steps on the surface of the first wire insulating film 156.

Figure 18B:
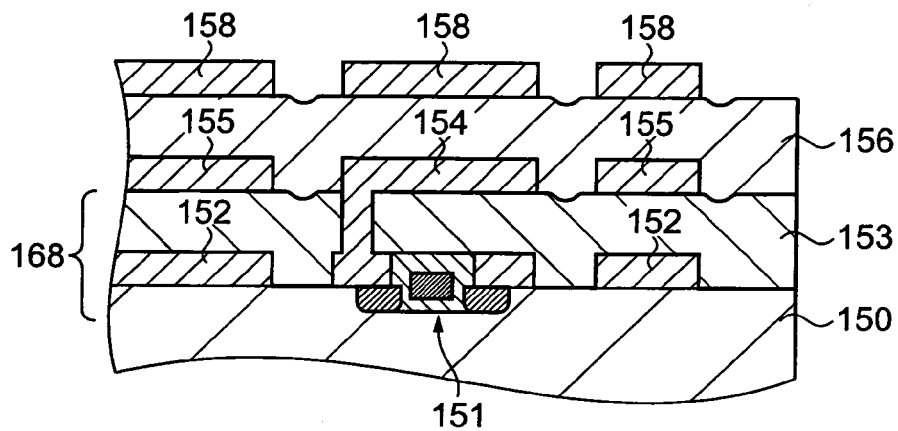

Then, as shown in FIG. 18B, second Al wires 158 are formed on the first wire insulating film 156.

Figure 18C:
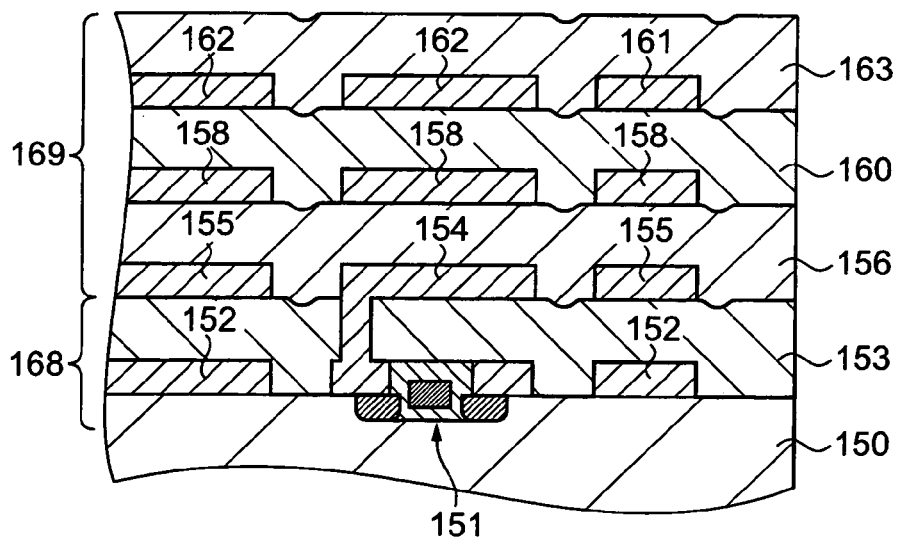

Subsequently, as shown in FIG. 18C, a second wire insulating film 160 made of $SiO_2$ is formed, and thereafter the surface of the second wire insulating film 160 is polished by CMP treatment.

Similarly, third Al wires 162 and an Al pad 161 are formed on the second wire insulating film 160, and formed thereon is a third wire insulating film 163. The surface of the third wire insulating film 163 is then polished by CMP treatment.

In this manner, a wire layer 169 is formed that is composed of the first, second and third Al wires 154, 158 and 162, and the first, second and third wire insulating films 156, 160 and 163.

Figure 19A:
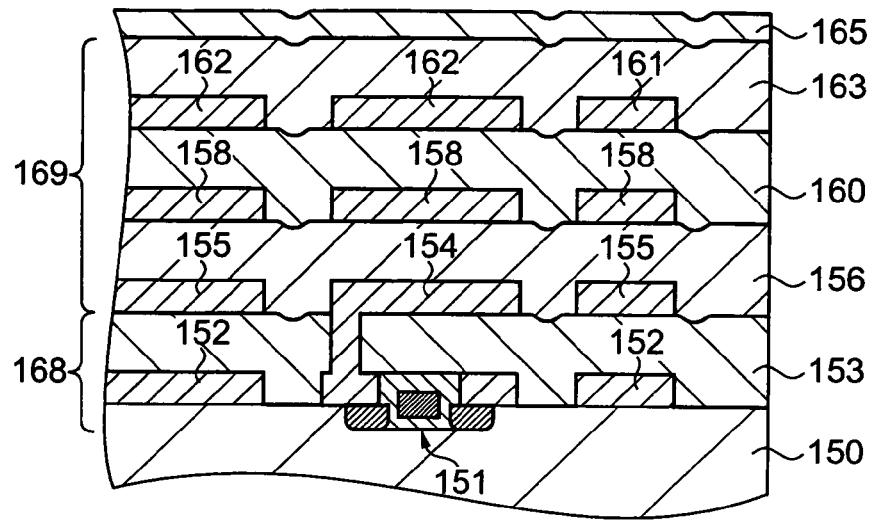
FIGS. 19A, 19B and 19C are partial sectional views schematically illustrating manufacturing steps for a surface acoustic wave device according to the eighth embodiment.
Figure 19B:
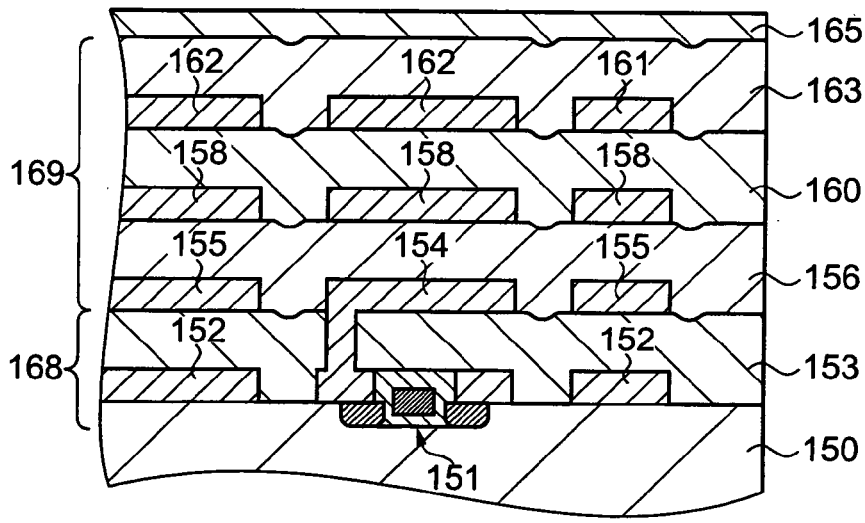

Subsequently, as shown in FIG. 19A, an interlayer insulating film 165 composed of $Si_3N_4$ is formed. Then, as shown in FIG. 19B, the surface of the interlayer insulating film 165 is polished by CMP treatment until it becomes flat.

Note that all the CMP treatment in the present embodiment described above is carried out for a not-yet-diced wafer.

Figure 19C:
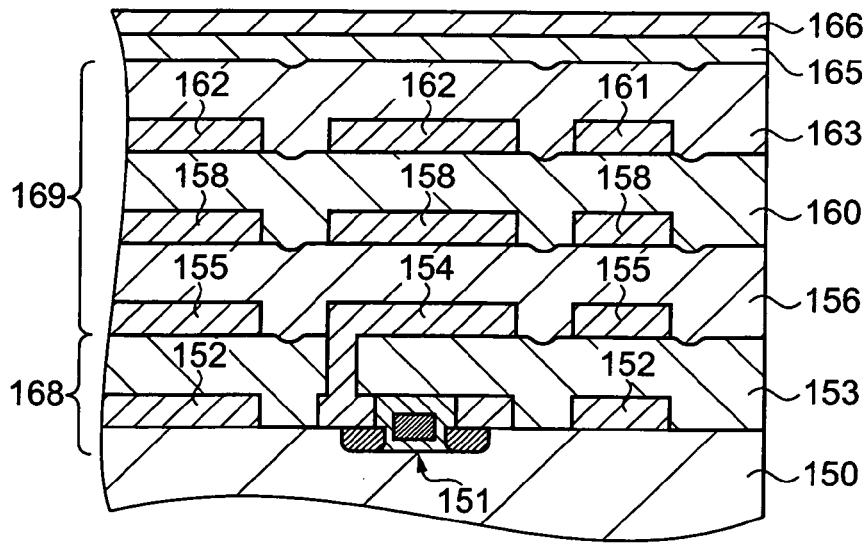

Then, as shown in FIG. 19C, a piezoelectric thin film 166 composed of ZnO is formed on the interlayer insulating film 165 flattened by CMP treatment.

Figure 20:
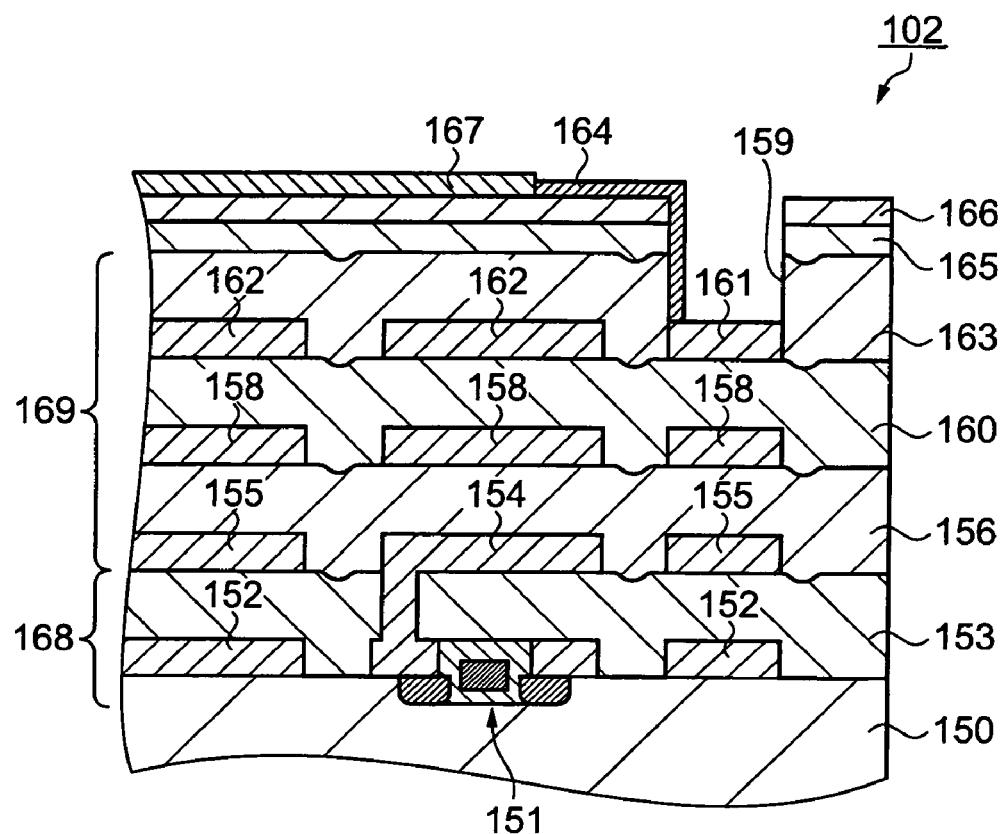
FIG. 20 is a partial sectional view schematically illustrating a manufacturing step for a surface acoustic wave device according to the eighth embodiment.

Thereafter, as shown in FIG. 20, the third wire insulating film 163, the interlayer insulating film 165, and the piezoelectric thin film 166 above the Al pad 161 are etched to provide an opening 159. A coupling Al wire 164 is then formed to extend from the Al pad 161 and across a sidewall of the opening 159 and the upper face of the piezoelectric thin film 166. A surface acoustic wave element 167 is then formed on the piezoelectric thin film 166.

In this manner, a surface acoustic wave device 102 formed in one chip by providing the surface acoustic wave element region above the IC region over the semiconductor substrate 150 can be obtained.

As described above, according to the method of manufacturing the surface acoustic wave device 102 of the present embodiment, the surface of the interlayer insulating film 165 is flattened by CMP treatment, and thus the piezoelectric thin film 166 can be formed on the interlayer insulating film 165 with keeping the flat state. Thus, the surface acoustic wave element 167 including IDT electrodes can be formed with favorable size accuracy since it is formed on the flat piezoelectric thin film 166, which can offer the surface acoustic wave device 102 involving no variation in the resonant frequency and having favorable characteristics. Furthermore, the planarization of surface of the interlayer insulating film 165 also leads to an advantage of enhancing the crystal orientation of the piezoelectric thin film 166, and thus offering a large electromechanical coupling coefficient $K^2$ of the surface acoustic wave element 167.

Furthermore, CMP treatment is implemented for the insulation layer 153, the first wire insulating film 156, the second wire insulating film 160 and the third wire insulating film 163 to thereby reduce the heights of the steps, and thus the planarization of the interlayer insulating film 165 by CMP treatment can be facilitated. When depositing multi-layered Al wires, the CMP treatment for the respective insulating films prevents increase of the heights of the steps, and thus provides an advantageous effect for the planarization of the interlayer insulating film 165.

Moreover, the CMP treatment is carried out for a not-yet-diced wafer including thereon a large number of surface acoustic wave devices 102, which allows efficient CMP treatment.

Ninth Embodiment

A ninth embodiment of the invention will be described in which the interlayer insulating film in the eighth embodiment is formed by using an SOG (Spin On Glass) film. The ninth embodiment employs the same steps as those of the eighth embodiment, shown in FIGS. 17A to 18C, until the formation of the third wire insulating film 163 in FIG. 18C. Therefore, the description of the steps will be omitted, and steps subsequent to the step of FIG. 18C will be described with reference to FIGS. 21A to 21C. The same members as those in the eighth embodiment are given the same numerals.

Figure 21A:
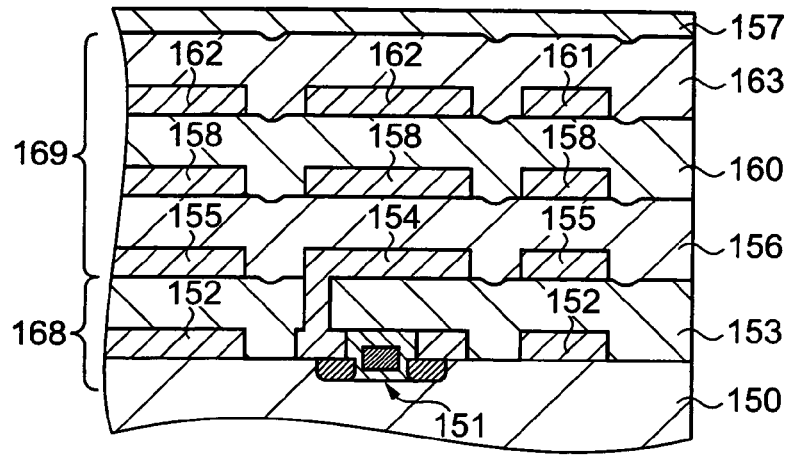
FIGS. 21A, 21B and 21C are partial sectional views schematically illustrating manufacturing steps for a surface acoustic wave device according to a ninth embodiment of the invention.

Referring to FIG. 21A, an SOG film is provided on the third wire insulating film 163 to form an interlayer insulating film 157. The SOG film as the interlayer insulating film 157 is formed by applying on the third wire insulating film 163 by spin-coating an inorganic or organic liquid SOG material for example, and then baking the applied material at a high temperature to volatilize the solvent, to thereby cause polymerization reaction of the SOG material. In the forming of the SOG film, the SOG material is applied and baked on a not-yet-diced wafer. At the time of the application, by applying the SOG material on the wire insulating film 163 and carrying out spin-coating, the SOG material flows into the steps on the surface of the third wire insulating film 163, which allows formation of the thin and flat interlayer insulating film 157.

Figure 21B:
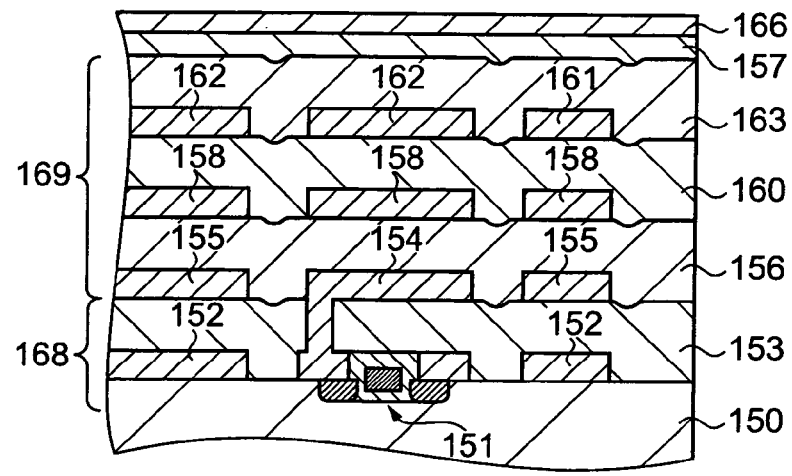

Then, as shown in FIG. 21B, the piezoelectric thin film 166 composed of ZnO is formed on the interlayer insulating film 157 formed of the SOG film.

Figure 21C:
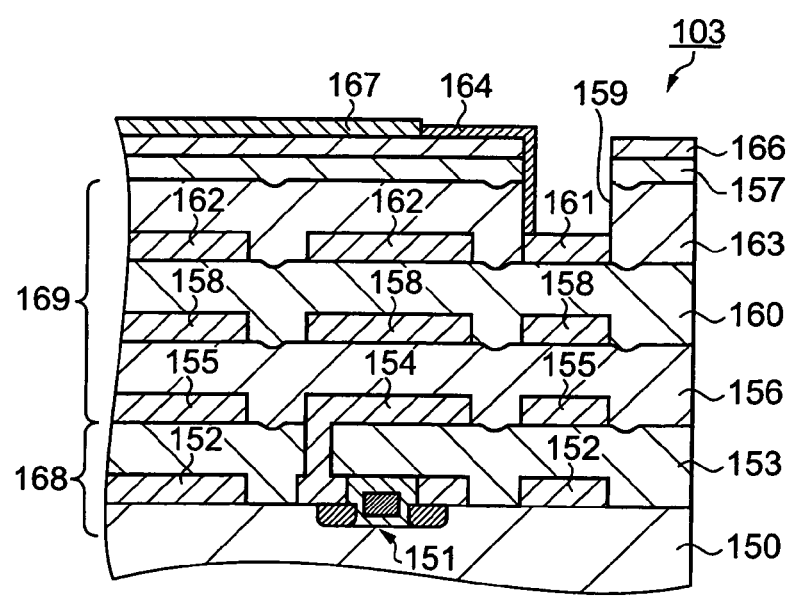

Thereafter, as shown in FIG. 21C, the third wire insulating film 163, the interlayer insulating film 157, and the piezoelectric thin film 166 above the Al pad 161 are etched to provide the opening 159. The coupling Al wire 164 is then formed to extend from the Al pad 161 and across a sidewall of the opening 159 and the upper face of the piezoelectric thin film 166. The surface acoustic wave element 167 is then formed on the piezoelectric thin film 166.

In this manner, a surface acoustic wave device 103 formed in one chip by providing the surface acoustic wave element region above the IC region over the semiconductor substrate 150 can be obtained.

As described above, forming the interlayer insulating film 157 by using an SOG film is also possible. Using an SOG film can provide the flat interlayer insulating film 157 easily at low costs. In addition, the piezoelectric thin film 166 can be formed on the interlayer insulating film 157 with keeping the flat state, and thus the surface acoustic wave element 167 can be formed with favorable size accuracy. Accordingly, the surface acoustic wave device 103 involving no variation in the resonant frequency and having favorable characteristics can be provided.

Tenth Embodiment

Description will be made about a surface acoustic wave device that includes a surface acoustic wave element region above an IC region according to an embodiment of the invention. A surface acoustic wave device of the present embodiment is manufacturing by the method of manufacturing a surface acoustic wave device of any of the above-described sixth to ninth embodiments (refer to FIGS. 12A and 12B).

For example, in the surface acoustic wave device 100 shown in FIG. 15, since the surface of the interlayer insulating film 138 of the surface acoustic wave device 100 is flattened, the piezoelectric thin film 139 can be formed on the interlayer insulating film 138 with keeping the flat state. Thus, the surface acoustic wave element 123 including IDT electrodes can be formed on the piezoelectric thin film 139 with favorable size accuracy, which can offer the surface acoustic wave device 100 involving no variation in the resonant frequency and having favorable characteristics. Furthermore, the planarization of surface of the interlayer insulating film 138 also leads to an advantage of enhancing the crystal orientation of the piezoelectric thin film 139, and thus offering a large electromechanical coupling coefficient $K^2$.

Moreover, since the surface acoustic wave element region is provided above the IC region, the chip area can be reduced compared with the case of arranging them horizontally, which allows miniaturization of the surface acoustic wave device.

In addition, such a structure shortens the length of wires coupling the IC region with the surface acoustic wave element region, and therefore enhancement of high frequency characteristics can be expected.

It should be noted that another embodiment is also allowed in which a wire insulating film in a wire layer in the above-described embodiments is formed by using an SOG film to thereby offer a wire layer with a flat surface.

Furthermore, although the above-described embodiments employ silicon as the material of a semiconductor substrate, any of other materials, such as Ge, SiGe, SiC, SiSn, PbS, GaAs, InP, GaP, GaN and ZnSe, can be used.

Moreover, although the above-described embodiments employ ZnO as the material of a piezoelectric thin film, AlN or another material can also be used.

In addition, although the above-described embodiments employ a SAW resonator as a surface acoustic wave element, a surface acoustic wave filter can also be employed.

The entire disclosure of Japanese Patent Application Nos: 2004-367210, filed Dec. 12, 2004 and 2005-269716, filed Sep. 16, 2005 are expressly incorporated by reference herein.

What is claimed is:

1. A method of manufacturing a surface acoustic wave device formed in one chip and including over a semiconductor substrate at least an IC region and a surface acoustic wave element region that are horizontally disposed, the method comprising:
    forming in the IC region over the semiconductor substrate a semiconductor element layer that includes a semiconductor element and an insulation layer covering the semiconductor element and being deposited also in the surface acoustic wave element region;
    forming over the semiconductor element layer a wire layer that includes a plurality of wires coupled to the semiconductor element and a wire insulating film deposited over the plurality of wires to provide insulation among the wires, the wire insulating film being deposited also over the insulation layer in the surface acoustic wave element region;
    forming an interlayer insulating film having a flattened surface on the wire insulating film in the IC region and the surface acoustic wave element region;
    forming a piezoelectric thin film on the interlayer insulating film; and
    forming a surface acoustic wave element on the piezoelectric thin film in the surface acoustic wave element region.

2. The method of manufacturing a surface acoustic wave device according to claim 1, wherein
    the forming an interlayer insulating film having a flattened surface is carried out by implementing CMP treatment for a surface of an interlayer insulating film after forming the interlayer insulating film.

3. The method of manufacturing a surface acoustic wave device according to claim 1, wherein
    the forming an interlayer insulating film having a flattened surface is carried out by forming an SOG film.

4. The method of manufacturing a surface acoustic wave device according to claim 1, further comprising:
    forming at least one layer-thickness adjusting film on any of the semiconductor substrate, the insulation layer, and the wire insulating film in the surface acoustic wave element region.

5. The method of manufacturing a surface acoustic wave device according to claim 4, wherein
    the layer-thickness adjusting film is included below the surface acoustic wave element, and is formed to have such a position and an area that a region in which the layer-thickness adjusting film is formed includes a region obtained by projecting, in a thickness direction of the surface acoustic wave device, a region in which the surface acoustic wave element is formed.

6. The method of manufacturing a surface acoustic wave device according to claim 4, wherein
    the forming a layer-thickness adjusting film is carried out simultaneously with forming the wires, and the layer-thickness adjusting film is formed together with the wires in the same layer.

7. The method of manufacturing a surface acoustic wave device according to claim 1, further comprising:
    implementing CMP treatment for surfaces of the insulation layer and the wire insulating film after forming the insulation layer and the wire insulating film, or forming an SOG film as the insulation layer and the wire insulating film.

8. The method of manufacturing a surface acoustic wave device according to claim 1, wherein
    CMP treatment is implemented or an SOG film is formed for a not-yet-diced wafer including a large number of the surface acoustic wave devices.

9. A surface acoustic wave device formed in one chip and including over a semiconductor substrate at least an IC region and a surface acoustic wave element region that are horizontally disposed, comprising:
    a semiconductor element layer including a semiconductor element and an insulation layer in the IC region over the semiconductor substrate, the insulation layer covering the semiconductor element and being deposited also in the surface acoustic wave element region;
    a wire layer formed over the semiconductor element layer by depositing wires coupled to the semiconductor element and a wire insulating film that provides insulation among the wires and is deposited also in the surface acoustic wave element region;
    an interlayer insulating film formed on the wire insulating film in the IC region and the surface acoustic wave element region, and having a flattened surface;
    a piezoelectric thin film formed on the interlayer insulating film; and
    a surface acoustic wave element formed on the piezoelectric thin film in the surface acoustic wave element region.

10. The surface acoustic wave device according to claim 9, wherein
    at least one layer-thickness adjusting film is formed on any of the semiconductor substrate, the insulation layer, and the wire insulating film in the surface acoustic wave element region.

11. The surface acoustic wave device according to claim 10, wherein
    the layer-thickness adjusting film is included below the surface acoustic wave element, and is formed to have such a position and an area that a region in which the layer-thickness adjusting film is formed includes a region obtained by projecting, in a thickness direction of the surface acoustic wave device, a region in which the surface acoustic wave element is formed.

12. A method of manufacturing a surface acoustic wave device formed in one chip and including over a semiconductor substrate at least an IC region and a surface acoustic wave element region that is disposed above the IC region, the method comprising:
    forming in the IC region over the semiconductor substrate a semiconductor element layer that includes a semiconductor element and an insulation layer covering the semiconductor element, the insulation layer also covering the surface acoustic wave element region;
    forming over the semiconductor element layer a wire layer that includes a plurality of wires coupled to the semiconductor element and a wire insulating film deposited over the plurality of wires to provide insulation among the wires, the wire insulating film also covering the surface acoustic wave element region;
    forming on the wire layer an interlayer insulating film having a flattened surface;
    forming a piezoelectric thin film on the interlayer insulating film; and forming a surface acoustic wave element on the piezoelectric thin film in the surface acoustic wave element region.

13. The method of manufacturing a surface acoustic wave device according to claim 12, wherein
the forming an interlayer insulating film having a flattened surface is carried out by implementing CMP treatment for a surface of an interlayer insulating film after forming the interlayer insulating film.

14. The method of manufacturing a surface acoustic wave device according to claim 12, wherein
the forming an interlayer insulating film having a flattened surface is carried out by forming an SOG film.

15. The method of manufacturing a surface acoustic wave device according to claim 12, further comprising:
implementing CMP treatment for surfaces of the insulation layer and the wire insulating film after forming the insulation layer and the wire insulating film, or forming an SOG film as the insulation layer and the wire insulating film.

16. The method of manufacturing a surface acoustic wave device according to claim 12, wherein
CMP treatment is implemented or an SOG film is formed for a not-yet-diced wafer including a large number of the surface acoustic wave devices.

17. A surface acoustic wave device formed in one chip and including over a semiconductor substrate at least an IC region and a surface acoustic wave element region that is disposed above the IC region, comprising:
a semiconductor element layer that includes a semiconductor element and an insulation layer covering the semiconductor element in the IC region on the semiconductor substrate, the insulation layer also covering the surface acoustic wave element region;
a wire layer formed over the semiconductor element layer by depositing wires coupled to the semiconductor element and a wire insulating film for providing insulation among the wires, the wire insulating film covering both the IC region and the surface acoustic wave element region;
an interlayer insulating film formed on the wire insulating film in the IC region, and having a flattened surface;
a piezoelectric thin film formed on the interlayer insulating film; and
a surface acoustic wave element formed on the piezoelectric thin film in the surface acoustic wave element region.

* * * * *